US012707825B2

(12) United States Patent
Lee et al.

(10) Patent No.: US 12,707,825 B2
(45) Date of Patent: Aug. 11, 2026

(54) DISPLAY APPARATUS AND METHOD OF MANUFACTURING THE SAME

(71) Applicant: Samsung Display Co., Ltd., Yongin-si (KR)

(72) Inventors: Jeongseok Lee, Yongin-si (KR); Wooyong Sung, Yongin-si (KR); Seungyong Song, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 413 days.

(21) Appl. No.: 18/474,461

(22) Filed: Sep. 26, 2023

(65) Prior Publication Data

US 2024/0107817 A1 Mar. 28, 2024

(30) Foreign Application Priority Data

Sep. 27, 2022 (KR) ........................ 10-2022-0122865

(51) Int. Cl.
*H10K 59/122* (2023.01)
*H10K 59/12* (2023.01)
*H10K 59/88* (2023.01)

(52) U.S. Cl.
CPC ....... *H10K 59/122* (2023.02); *H10K 59/1201* (2023.02); *H10K 59/88* (2023.02)

(58) Field of Classification Search
CPC ... H10K 59/88; H10K 59/1201; H10K 59/122
See application file for complete search history.

(56) References Cited

U.S. PATENT DOCUMENTS 9,431,634 B2 8/2016 Song
2007/0263164 A1* 11/2007 Kumagai ............. H10K 59/122 349/156
2014/0291623 A1 10/2014 Choi
2018/0151831 A1* 5/2018 Lee .................. H10K 59/80522
2020/0105845 A1 4/2020 Yang et al.

FOREIGN PATENT DOCUMENTS

KR 20100128020 A * 12/2010 ............. H10K 59/35
KR 10-2014-0120427 10/2014
KR 10-1502206 3/2015
KR 10-2016-0137715 A 12/2016
KR 10-2020-0036451 4/2020
KR 10-2021-0083702 7/2021
WO 2022/050984 A1 3/2022

* cited by examiner

*Primary Examiner* — Abdulmajeed Aziz
*Assistant Examiner* — Nathaniel J Lee
(74) *Attorney, Agent, or Firm* — Womble Bond Dickinson (US) LLP

(57) ABSTRACT

A display apparatus includes: a first subpixel electrode; a bus electrode adjacent to the first pixel electrode; a metal bank layer including a first opening overlapping the first subpixel electrode, the metal bank layer comprising a first metal layer and a second metal layer disposed on the first metal layer; an insulating layer disposed on the first subpixel electrode and the bus electrode and under the metal bank layer; a first intermediate layer overlapping the first subpixel electrode in the first opening of the metal bank layer; and a first counter electrode disposed on the first intermediate layer in the first opening of the metal bank layer, wherein the metal bank layer is electrically connected to the bus electrode through a contact hole defined in the insulating layer.

20 Claims, 27 Drawing Sheets

300
320
310
3113
3210
115h
2113
2210
115h
1113
1210
BE
VSL
BE
VSL
PC3
PC2
PC1
PA3
NPA
PA2
NPA
PA1
115
111
CM
109
107
105
103
101
100
Z

MK1
300
320
310
3113
3210
PR1
PT1
PT2
OP1
G
115h
BE
VSL
115
1113
1210
111
CM
109
107
105
103
101
100
Z
PC1
PC2
PC3
PA1
PA2
PA3
NPA 1510
320
310
300
3113
3210
1230b
1220b
PT2
G
PT2
1230c
1220c
BE
VSL
PT2
G
PT2
1230b
1220b
1230
PT1
OP1
PT1
1220
BE
VSL
1210
PC3
PC2
PC1
PA3
NPA
PA2
NPA
PA1
115
1113
1210
111
CM
109
107
105
103
101
100
Z

DISPLAY APPARATUS AND METHOD OF MANUFACTURING THE SAME

CROSS-REFERENCE TO RELATED APPLICATION(S)

This application claims priority to and benefits of Korean Patent Application No. 10-2022-0122865 under 35 U.S.C. § 119, filed on Sep. 27, 2022, in the Korean Intellectual Property Office, the entire contents of which are incorporated herein by reference.

BACKGROUND

1. Technical Field

One or more embodiments relate to a display apparatus and method of manufacturing the display apparatus.

2. Description of the Related Art

A display apparatus is an apparatus for visually expressing image data. Display apparatuses may display images by using light-emitting diodes. Usage of display apparatuses has been more diversified. Accordingly, various researches have been conducted to improve the quality of display apparatuses.

SUMMARY

One or more embodiments provide a display apparatus and a method of manufacturing the display apparatus by using openings of a metal bank layer.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display apparatus may include a first subpixel electrode, a bus electrode adjacent to the first subpixel electrode, the metal bank layer including a first opening overlapping the first subpixel electrode and including a first metal layer and a second metal layer disposed on the first metal layer, an insulating layer disposed on the first subpixel electrode and the bus electrode and under the metal bank layer, a first intermediate layer overlapping the first subpixel electrode in the first opening of the metal bank layer, and a first counter electrode disposed on the first intermediate layer in the first opening of the metal bank layer, wherein the metal bank layer may be electrically connected to the bus electrode through a contact hole defined in the insulating layer.

The first counter electrode may contact a side surface of the metal bank layer facing the first opening of the metal bank layer.

An outer portion of the first counter electrode may contact the side surface of the first metal layer facing the first opening of the metal bank layer.

A lower surface of the metal bank layer may contact the bus electrode through a contact hole of the insulating layer.

A portion of the second metal layer facing the first opening of the metal bank layer may include a protruding portion extending toward the first opening from a point at which a lower surface of the second metal layer contacts the side surface of the first metal layer.

A length of the protruding portion of the second metal layer may be in a range of about 0.3 μm to about 1 μm.

The display apparatus may further include a protective layer between the outer portion of the first subpixel electrode and the insulating layer.

The protective layer may include a transparent conductive oxide.

The display apparatus may further include a first dummy intermediate layer disposed on the second metal layer, wherein the first dummy intermediate layer and the first intermediate layer may include a same material.

The display apparatus may further include a first dummy counter electrode disposed on the first dummy intermediate layer, wherein a first dummy counter electrode and the first counter electrode may include a same material.

The display apparatus may further include a second subpixel electrode, a second intermediate layer overlapping the second subpixel electrode in a second opening of the metal bank layer, and a second counter electrode overlapping the second intermediate layer in the second opening of the metal bank layer.

The metal bank layer may further include a groove disposed between the first subpixel electrode and the second subpixel electrode, the groove concaved from an upper surface of the metal bank layer, and the bus electrode may be between the first subpixel electrode and the second subpixel electrode.

The display apparatus may further include an auxiliary conductive layer electrically connected to the bus electrode.

According to an embodiment, a method of manufacturing a display apparatus may include forming a first subpixel electrode, forming a bus electrode adjacent to the first subpixel electrode, forming an insulating layer overlapping an outer portion of the first subpixel electrode and an outer portion of the bus electrode and including a contact hole exposing a portion of the bus electrode, forming a metal bank layer including a first opening overlapping the first subpixel electrode, the metal bank layer including a first metal layer and a second metal layer on the first metal layer and electrically connected to the bus electrode through the contact hole of the insulating layer, forming a first intermediate layer overlapping the first subpixel electrode in the first opening of the metal bank layer, and forming a first counter electrode disposed above the first intermediate layer in the first opening of the metal bank layer.

The forming of the first counter electrode may include depositing the first counter electrode such that the outer portion of the first counter electrode may contact a side surface of the first metal layer facing the first opening of the metal bank layer.

A lower surface of the metal bank layer may contact the bus electrode through a contact hole of the insulating layer.

The forming of the metal bank layer may include forming an opening overlapping the first subpixel electrode in each of the first metal layer and the second metal layer; and selectively etching the second metal layer among the first metal layer and the second metal layer, wherein the second metal layer may include a protruding portion extending toward the first opening from a point at which a lower surface of the second metal layer contacts the side surface of the first metal layer.

The method may further include forming a protective layer disposed between the outer portion of the first subpixel electrode and the insulating layer, the protective layer including a transparent conductive oxide.

The method may further include forming the second subpixel electrode adjacent to the first subpixel electrode, and forming, in the metal bank layer, a groove corresponding to a space between the first subpixel electrode and the second subpixel electrode.

The bus electrode may be between the first subpixel electrode and the second subpixel electrode.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
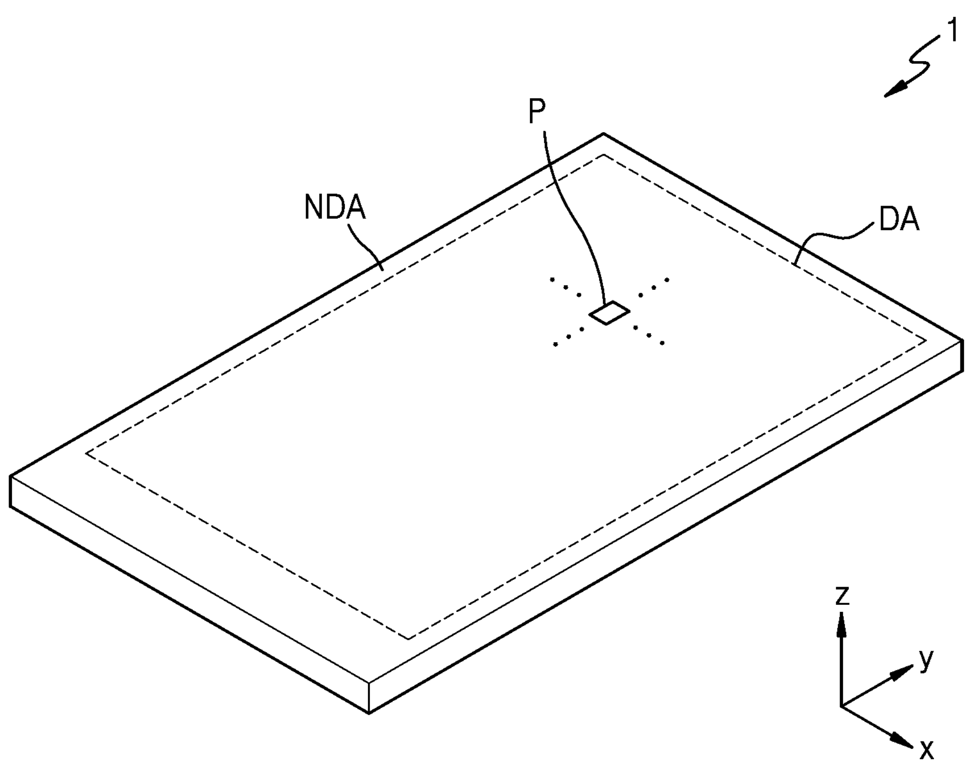
FIGS. 1A and 1B are schematic perspective views of a display apparatus according to an embodiment, respectively.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including,"

when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

Figure 1B:
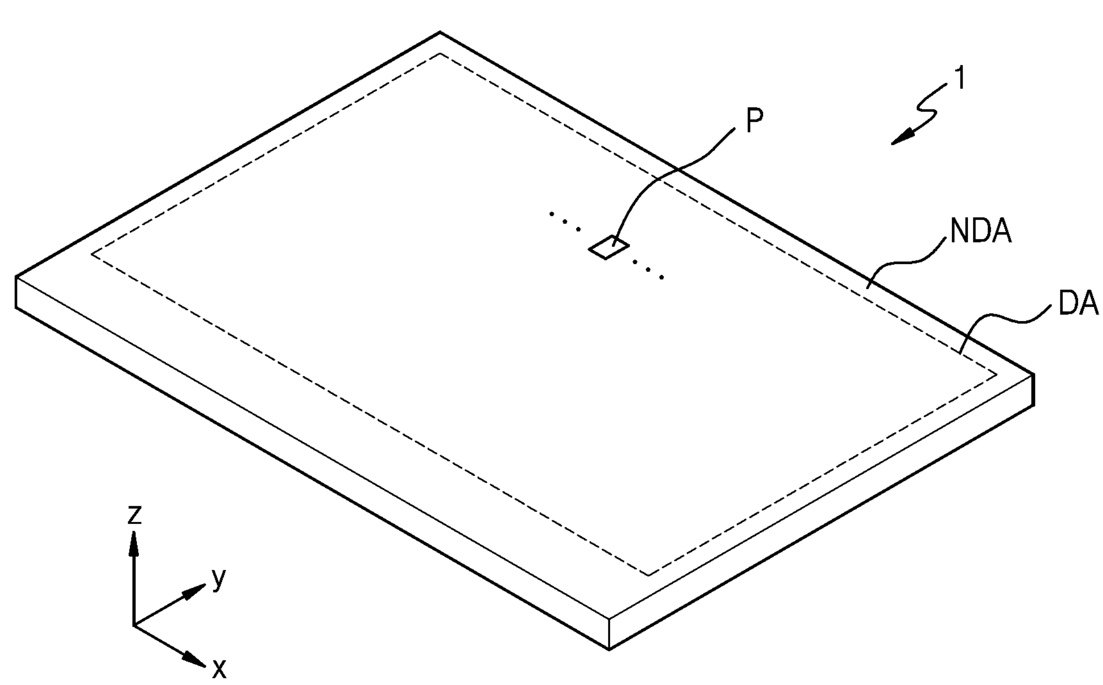

FIGS. 1A and 1B are each a schematic perspective view of a display apparatus 1 according to an embodiment.

Referring to FIGS. 1A and 1B, the display apparatus 1 may include a display area DA and a non-display area NDA outside the display area DA. The display area DA may display images by subpixels P arranged in the display area DA. The non-display area NDA, which is outside the display area DA and does not display images, may generally surround the display area DA. A driver and the like for providing electric signals or power to the display area DA may be arranged in the non-display area NDA. A pad may be arranged in the non-display area NDA. Electronic devices, a printed circuit board, and the like may be connected (e.g., electrically connected) to the non-display area NDA.

According to an embodiment, FIG. 1A illustrates that the display area DA is a polygon (e.g., a square) in which a length in the x direction is smaller than a length in the y direction. However, according to another embodiment, the display area DA shown in FIG. 1B may be a polygon (e.g., a square) in which a length in the x direction is larger than a length in the y direction. Although FIGS. 1A and 1B illustrate that the display area DA is approximately square, embodiments are not limited thereto. According to another embodiment, the display area DA may have various shapes, for example, an n-sided shape (where n is a natural number equal to or greater than 3), a circle, an oval, or the like. FIGS. 1A and 1B illustrate that a corner portion of the display area DA includes a shape including a vertex at which a straight line and another straight line meet each other. However, according to another embodiment, the display area DA may include a polygon having rounded corner portions.

Hereinafter, for convenience of explanation, a case in which the display apparatus 1 includes an electronic device, such as a smart phone, will be described, but the display apparatus 1 of the embodiments is not limited thereto. The display apparatus 1 may be applied to various products such as televisions, notebooks, monitors, billboard charts, Internet of Things (IoT) device, as well as portable electronic devices such as mobile phones, smart phones, tablet personal computers, mobile terminals, electronic organizers, electronic books, portable media players (PMP), ultra mobile PCs (UMPC), and the like. For example, the display apparatus 1 according to an embodiment may be applied to wearable devices such as smart watches, watch phones, and head mounted displays. For example, the display apparatus 1 according to an embodiment may be applied to a display screen arranged on a rear surface of a front sheet as a dashboard of a car, a center information display (CID) arranged on a center fascia or dashboard of a car, a rear mirror display replacing a side mirror of a car, or a display screen as entertainment for passengers in the rear seats of a car.

Figure 2A:
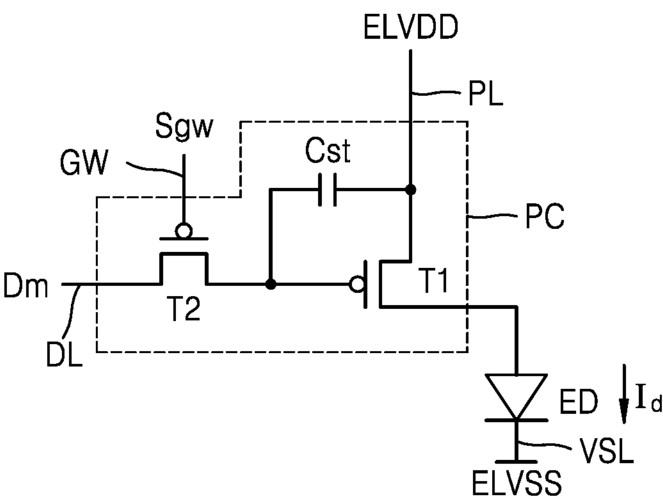
FIG. 2A is a schematic diagram of an equivalent circuit of a light-emitting diode corresponding to a subpixel of a display apparatus according to an embodiment and a subpixel circuit PC electrically connected to the light-emitting diode.

FIG. 2A is a schematic diagram of an equivalent circuit of a light-emitting diode ED corresponding to a subpixel of the display apparatus 1 according to an embodiment and a subpixel circuit PC connected (e.g., electrically connected) to the light-emitting diode ED.

Referring to FIG. 2A, the light-emitting diode ED may be connected (e.g., electrically connected) to the subpixel circuit PC, and the subpixel circuit PC may include a first transistor T1, a second transistor T2, and a storage capacitor Cst. A subpixel electrode (e.g., an anode) of the light-emitting diode ED may be connected (e.g., electrically connected) to the first transistor T1, a counter electrode (e.g., a cathode) may be connected (e.g., electrically connected) to an auxiliary conductive layer (or auxiliary wiring) VSL and may receive a voltage (e.g., a common voltage ELVSS) from the auxiliary conductive layer VSL.

The second transistor T2 may transmit a data signal Dm, which is input through a data line DL, to the first transistor T1, in response to a scan signal Sgw input through a scan line GW.

The storage capacitor Cst may be connected to the second transistor T2 and a driving voltage line PL, and may store a voltage corresponding to a difference between the voltage transmitted from the second transistor T2 and a driving voltage ELVDD provided to the driving voltage line PL.

The first transistor T1 may be connected to the driving voltage line PL and the storage capacitor Cst, and may control a driving current $I_d$ flowing through the light-emitting diode ED from the driving voltage line PL, in response to a value of the voltage stored in the storage capacitor Cst. Due to the driving current $I_d$, the light-emitting diode ED may emit light having a certain luminance.

Although a case in which the subpixel circuit PC includes two transistors and one storage capacitor is described with reference to FIG. 2A, embodiments are not limited thereto.

Figure 2B:
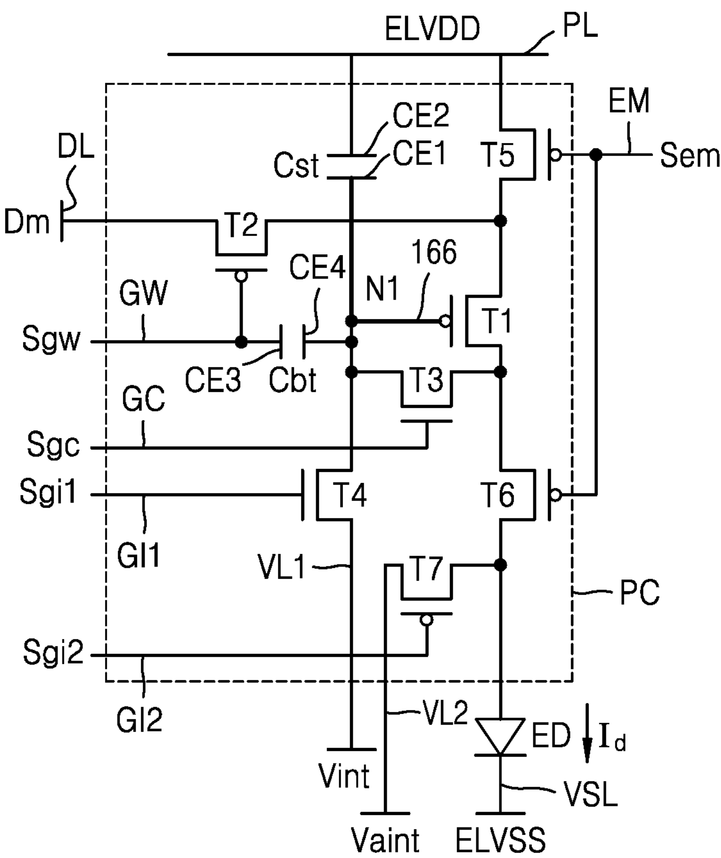
FIG. 2B is a schematic diagram of an equivalent circuit of a light-emitting diode corresponding to a subpixel of the display apparatus according to another embodiment and a subpixel circuit PC electrically connected to the light-emitting diode.

FIG. 2B is a schematic diagram of an equivalent circuit of a light-emitting diode ED corresponding to a subpixel of the display apparatus 1 according to another embodiment and a subpixel circuit PC connected (e.g., electrically connected) to the light-emitting diode ED.

Referring to FIG. 2B, the subpixel circuit PC may include seven transistors and two capacitors.

The subpixel circuit PC may include a first transistor T1, a second transistor T2, a third transistor T3, a fourth transistor T4, a fifth transistor T5, a sixth transistor T6, a seventh transistor T7, a storage capacitor Cst, and a boost capacitor Cbt. According to another embodiment, the subpixel circuit PC may not include the boost capacitor Cbt. A subpixel electrode (e.g., an anode) of the light-emitting diode ED may be connected (e.g., electrically connected) to the first transistor T1 via the sixth transistor T6, and a counter electrode (e.g., a cathode) of the light-emitting diode ED may be connected (e.g., electrically connected) to the auxiliary conductive layer VSL and may receive a voltage corresponding to the common voltage ELVSS through the auxiliary conductive layer VSL.

Some of the first transistor T1, the second transistor T2, the third transistor T3, the fourth transistor T4, the fifth transistor T5, the sixth transistor T6, and the seventh transistor T7 may be formed as an n-channel MOSFET (NMOS), and others may be formed as a p-channel MOSFET (PMOS). According to an embodiment, as shown in FIG. 2B, the third transistor T3 and the fourth transistor T4 may be formed as the NMOS, and the others may be formed as the PMOS. For example, the third transistor T3 and the fourth transistor T4 may be formed as the NMOS including an oxide semiconductor material, and the others may be formed as the PMOS including a silicon semiconductor material. According to another embodiment, the third transistor T3, the fourth transistor T4, and the seventh transistor T7 may be formed as the NMOS, and the others may be formed as the PMOS.

The first transistor T1, the second transistor T2, the third transistor T3, the fourth transistor T4, the fifth transistor T5, the sixth transistor T6, the seventh transistor T7, the storage capacitor Cst, and the boost capacitor Cbt may be connected to signal lines. The signal lines may include a scan line GW, an emission control line EM, a compensation gate line GC, a first initialization gate line GI1, a second initialization gate line GI2, and a data line DL. The subpixel circuit PC may be connected (e.g., electrically connected) to voltage lines, e.g., a driving voltage line PL, a first initialization voltage line VL1, and a second initialization voltage line VL2.

The first transistor T1 may include a driving transistor. A first gate electrode of the first transistor T1 may be connected to the storage capacitor Cst, a first electrode of the first transistor T1 may be connected (e.g., electrically connected) to the driving voltage line PL via the fifth transistor T5, and a second electrode of the first transistor T1 may be connected (e.g., electrically connected) to a first electrode (e.g., an anode) of the light-emitting diode ED via the sixth transistor T6. One of the first electrode and second electrode of the first transistor T1 may include a source electrode, and the other may include a drain electrode. The first transistor T1 may provide the driving current $I_d$ to the light-emitting diode ED, in response to a switching operation of the second transistor T2.

The second transistor T2 may include a switching transistor. A second gate electrode of the second transistor T2 may be connected to the scan line GW, a first electrode of the second transistor T2 may be connected to the data line DL, and a second electrode of the second transistor T2 may be connected to the first electrode of the first transistor T1 and connected (e.g., electrically connected) to the driving voltage line PL via the fifth transistor T5. One of the first electrode and the second electrode of the second transistor T2 may include a source electrode, and the other may include a drain electrode. The second transistor T2 may be turned on in response to the scan signal Sgw delivered through the scan line GW and may perform a switching operation of delivering the data signal Dm, which is delivered through the data line DL, to a first electrode of the first transistor T1.

The third transistor T3 may include a compensation transistor that compensates a threshold voltage of the first transistor T1. A third gate electrode of the third transistor T3 may be connected to the compensation gate line GC. A first electrode of the third transistor T3 may be connected to a lower electrode CE1 of the storage capacitor Cst and the first gate electrode of the first transistor T1 through a node connection line 166. The first electrode of the third transistor T3 may be connected to the fourth transistor T4. A second electrode of the third transistor T3 may be connected to the second electrode of the first transistor T1 and connected (e.g., electrically connected) to the first electrode (e.g., the anode) of the light-emitting diode ED via the sixth transistor T6. One of the first electrode and the second electrode of the third transistor T3 may include a source electrode, and the other may include a drain electrode.

The third transistor T3 may be turned on in response to a compensation signal Sgc transmitted through the compensation gate line GC, and may electrically connect the first gate electrode of the first transistor T1 and the second electrode (e.g., the drain electrode) of the first transistor T1, thereby diode-connecting the first transistor T1.

The fourth transistor T4 may include a first initialization transistor that initializes the first gate electrode of the first transistor T1. A fourth gate electrode of the fourth transistor T4 may be connected to the first initialization gate line GIL A first electrode of the fourth transistor T4 may be connected to a first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may include a source electrode, and the other may include a drain electrode. The fourth transistor T4 may be turned on in response to a first initialization signal Sgi1 transmitted through the first initialization gate line GI1 and may perform an initialization operation of initializing a voltage of the first gate electrode of the first transistor T1 by transmitting a first initialization voltage Vint to the first gate electrode of the first transistor T1.

The fifth transistor T5 may include an operation control transistor. A fifth gate electrode of the fifth transistor T5 may be connected to the emission control line EM, a first electrode of the fifth transistor T5 may be connected to the driving voltage line PL, and a second electrode of the fifth transistor T5 may be connected to the second electrode of the second transistor T2. One of the first electrode and second electrode of the fifth transistor T5 may include a source electrode, and the other may include a drain electrode.

The sixth transistor T6 may include an emission control transistor. A sixth gate electrode of the sixth transistor T6 may be connected to the emission control line EM, a first electrode of the sixth transistor T6 may be connected to the second electrode of the first transistor T1 and the second electrode of the third transistor T3, and a second electrode of the sixth transistor T6 may be connected (e.g., electrically connected) to a second electrode of the seventh transistor T7 and the first electrode (e.g., the anode) of the light-emitting diode ED. One of the first electrode and the second electrode of the sixth transistor T6 may include a source electrode, and the other may include a drain electrode.

The fifth transistor T5 and the sixth transistor T6 may be simultaneously turned on in response to an emission control signal Sem transmitted through the emission control line EM such that the driving voltage ELVDD may be transmitted to the light-emitting diode ED and the driving current $I_d$ may flow through the light-emitting diode ED.

The seventh transistor T7 may include a second initialization transistor that initializes the first electrode (e.g., the anode) of the light-emitting diode ED. A seventh gate electrode of the seventh transistor T7 may be connected to the second initialization gate line GI2. A first electrode of the seventh transistor T7 may be connected to a second initialization voltage line VL2. The second electrode of the seventh transistor T7 may be connected to the second electrode of the sixth transistor T6 and the first electrode (e.g., the anode) of the light-emitting diode ED. The seventh transistor T7 may be turned on in response to a second initialization signal Sgi2 transmitted through the second initialization gate line GI2 and may transmit a second initialization voltage Vaint to the first electrode (e.g., the anode) of the light-emitting diode ED to initialize the first electrode of the light-emitting diode ED.

In some embodiments, the second initialization voltage line VL2 may include a next scan line. For example, the second initialization gate line GI2 connected to the seventh transistor T7 of the subpixel circuit PC, which is arranged in an $i^{th}$ column, may correspond to a scan line of the subpixel circuit PC arranged in an $(i+1)^{th}$ column, where i is a natural number greater than 0. According to another embodiment, the second initialization voltage line VL2 may include the emission control line EM. For example, the emission control line EM may be connected (e.g., electrically connected) to the fifth transistor T5, the sixth transistor T6, and the seventh transistor T7.

The storage capacitor Cst may include the lower electrode CE1 and an upper electrode CE2. The lower electrode CE1 of the storage capacitor Cst may be connected to the first gate electrode of the first transistor T1, and the upper electrode CE2 of the storage capacitor Cst may be connected to the driving voltage line PL. The storage capacitor Cst may store an electric charge corresponding to a difference between the voltage of the first gate electrode of the first transistor T1 and the driving voltage ELVDD.

The boost capacitor Cbt may include a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. The boost capacitor Cbt may increase a voltage of the first node N1 in case that the scan signal Sgw provided from the scan line GW is turned off, and may clearly display a black grayscale in case that the voltage of the first node N1 increases.

The first node N1 may include an area to which the first gate electrode of the first transistor T1, the first electrode of the third transistor T3, the second electrode of the fourth transistor T4, and the fourth electrode CE4 of the boost capacitor Cbt are connected.

In an embodiment, FIG. 2B describes that the third transistor T3 and fourth transistor T4 may be formed as the NMOS, and the first transistor T1, the second transistor T2, the fifth transistor T5, the sixth transistor T6, and the seventh transistor T7 may be formed as the PMOS. The first transistor T1, which directly influences a luminance of the display apparatus 1 that displays images, includes a semiconductor layer including polycrystalline silicon. Thus, a high-resolution display apparatus may be implemented.

Although a case in which some of the transistors are the NMOS and others are the PMOS is described with reference to FIG. 2B, embodiments are not limited thereto. According to another embodiment, the subpixel circuit PC may be variously modified. For example, the subpixel circuit PC may include three transistors and all of the three transistors may be formed as the NMOS.

Figure 3A:
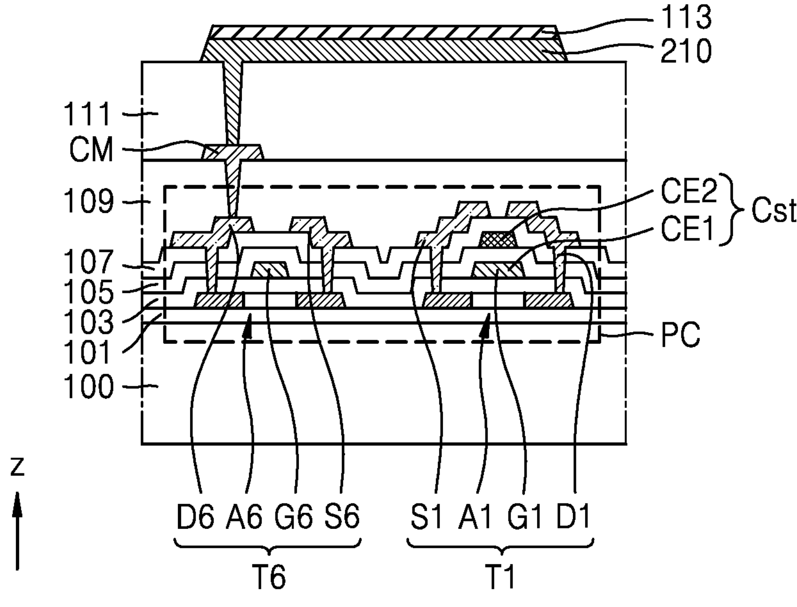
FIGS. 3A to 3J are each a schematic cross-sectional view of a state of a display apparatus according to an embodiment, according to a manufacturing process.
Figure 3B:
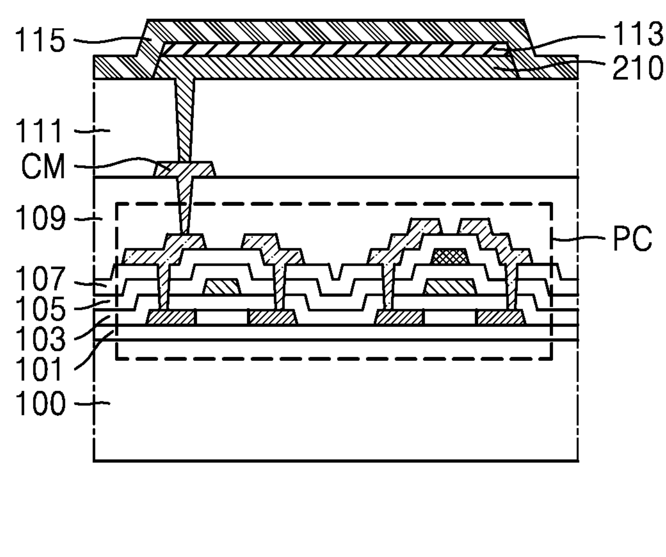
Figure 3C:
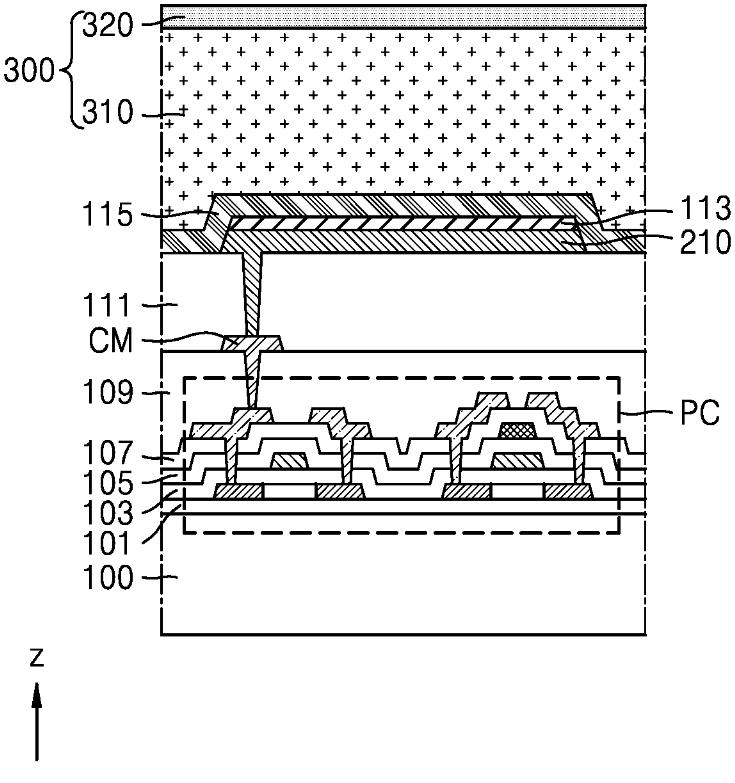
Figure 3D:
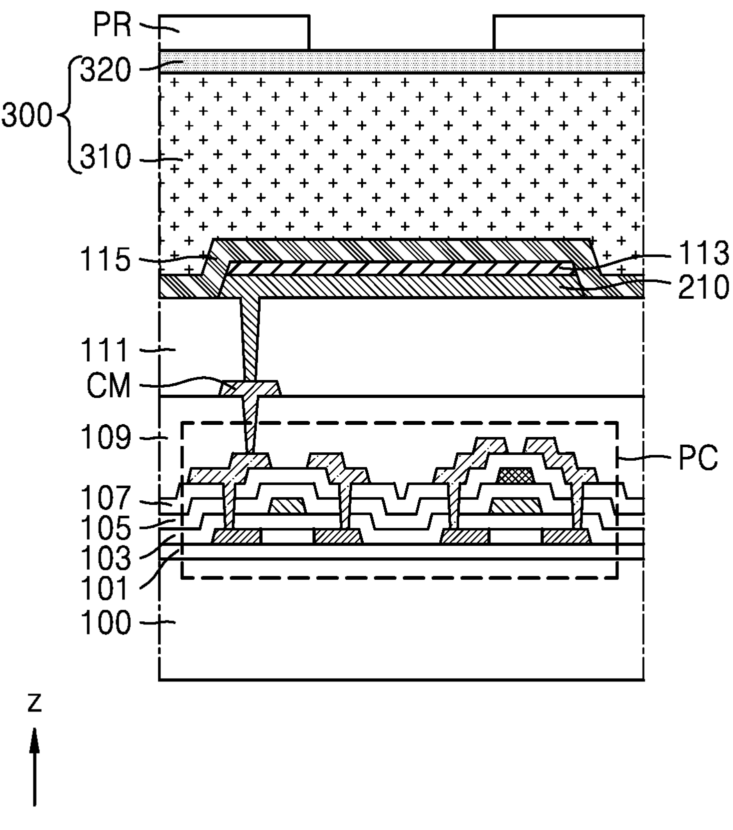
Figure 3E:
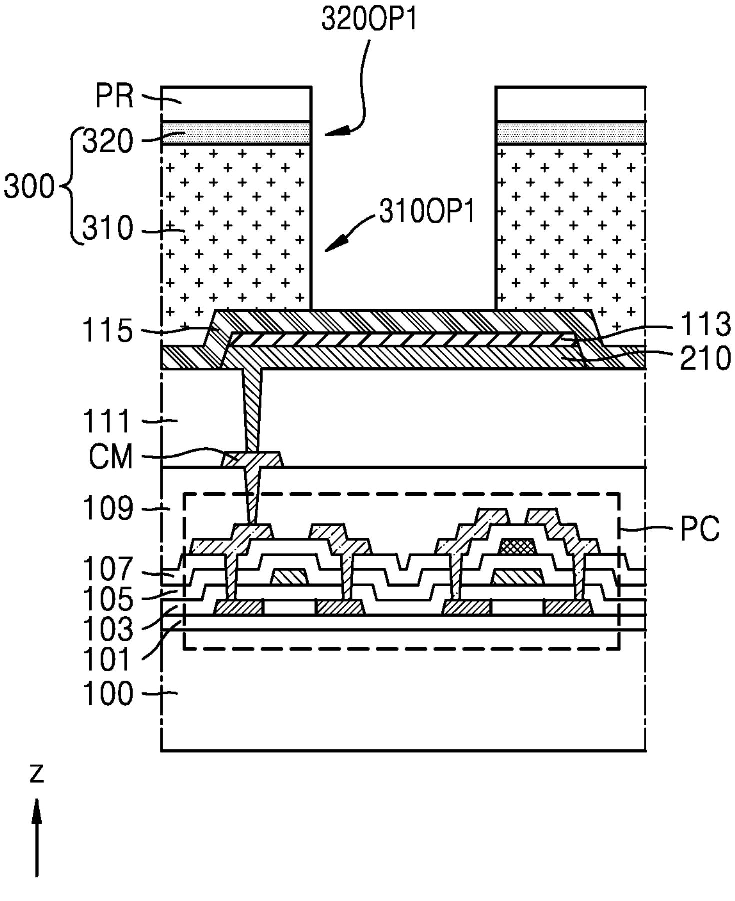
Figure 3F:
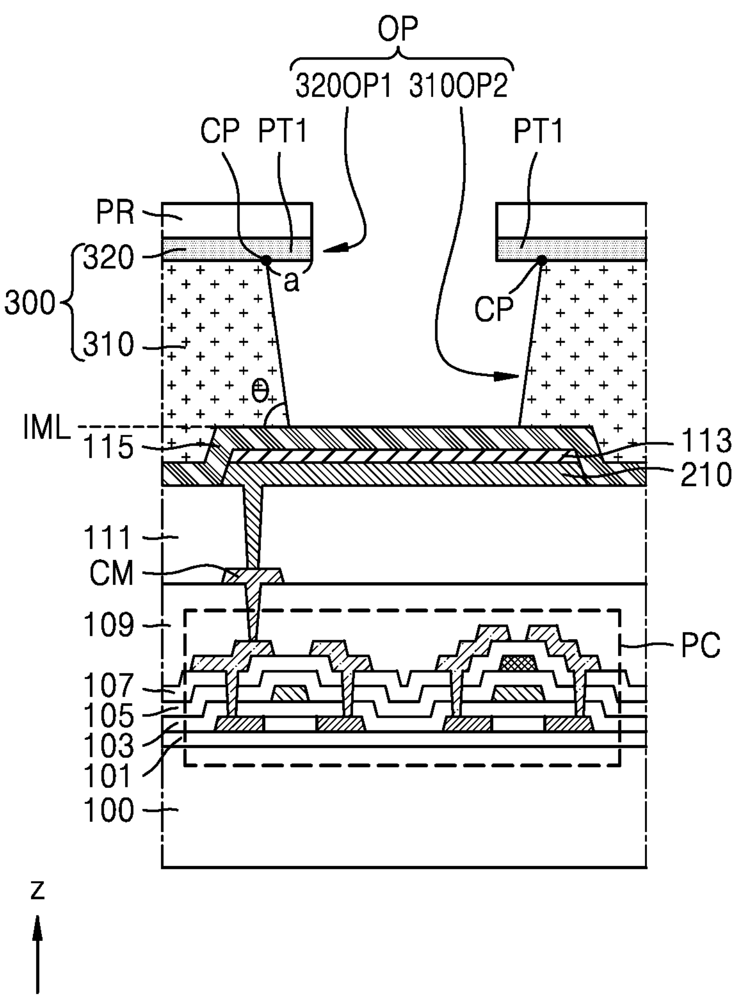
Figure 3G:
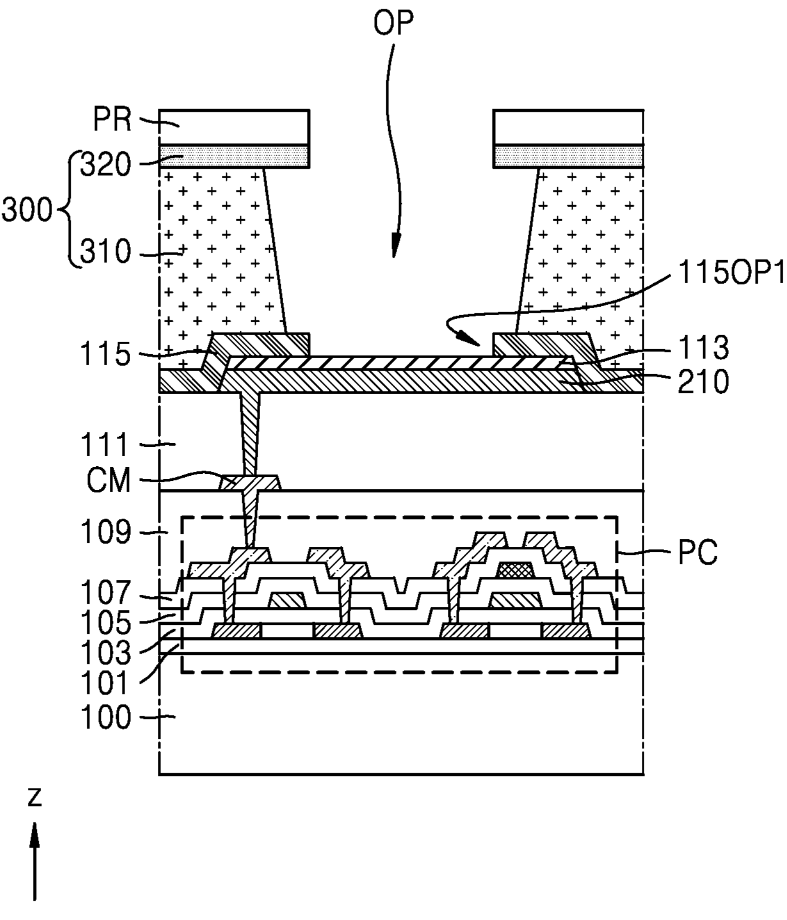
Figure 3H:
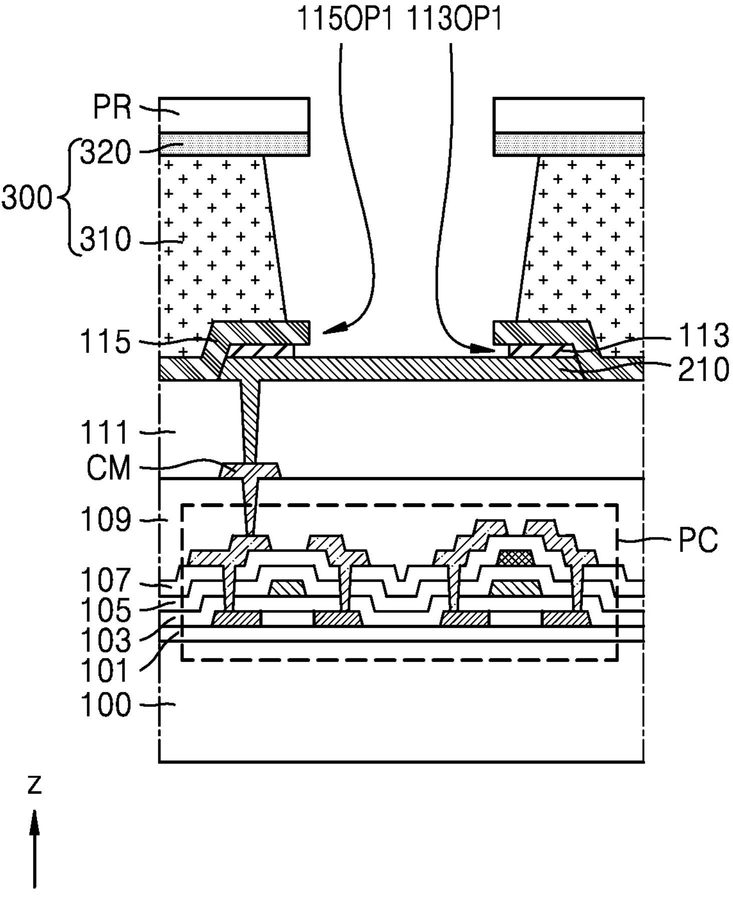
Figure 3I:
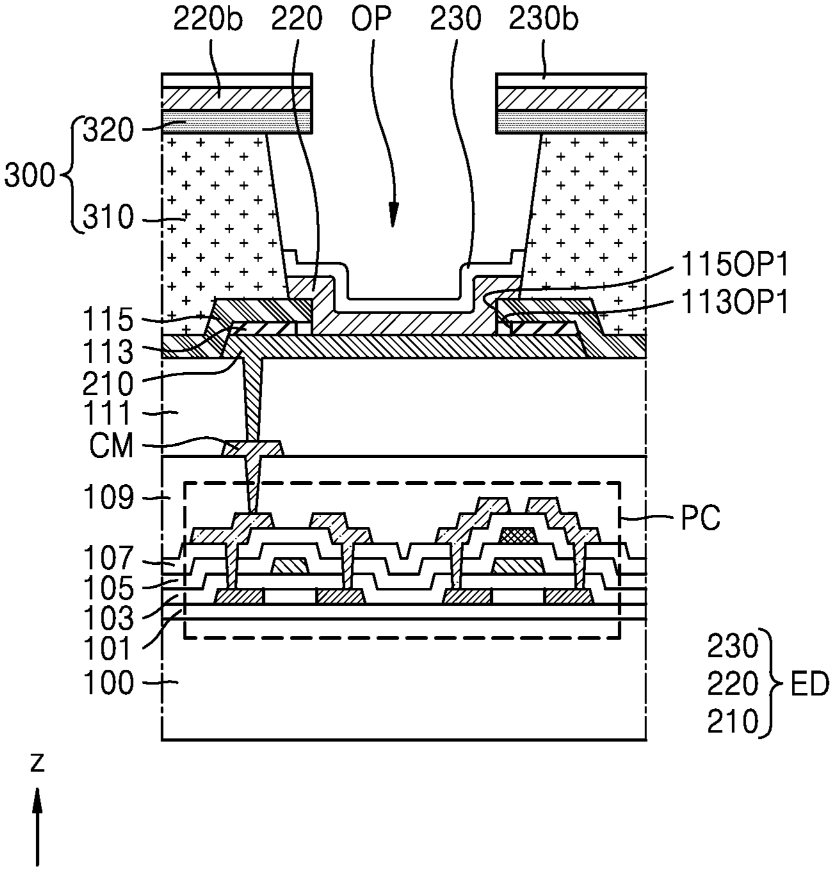
Figure 3J:
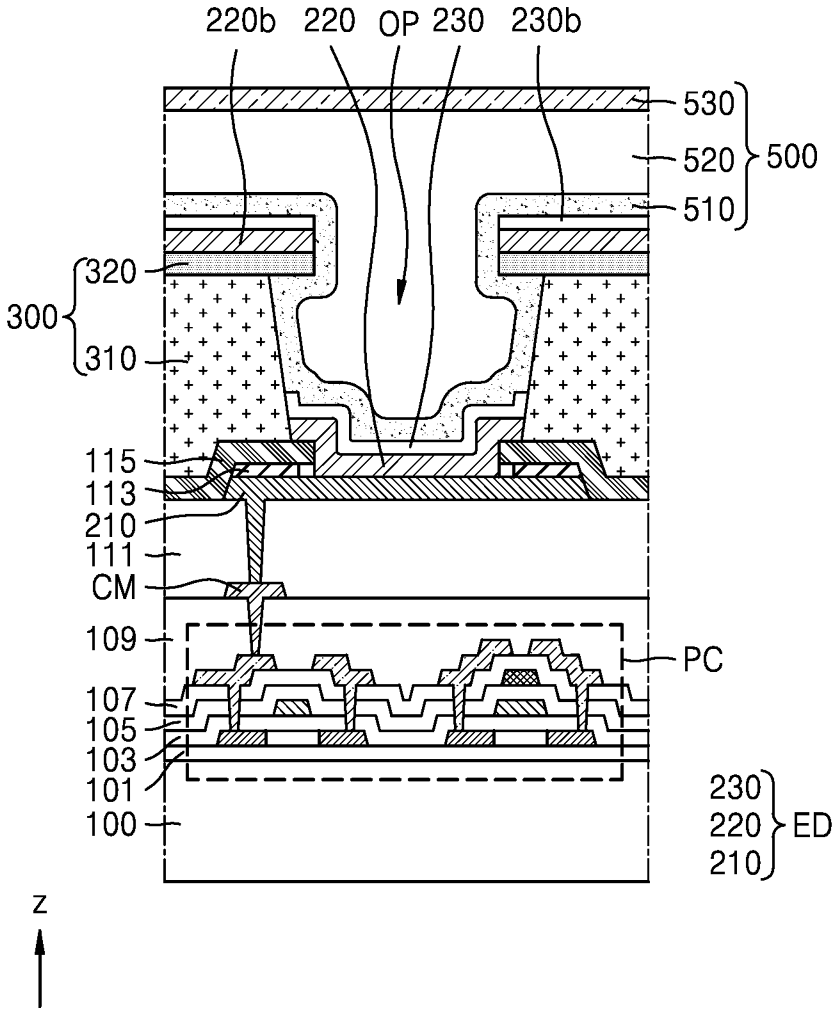
Figure 3K:
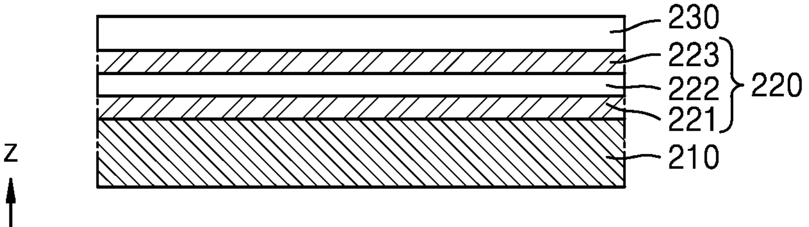
FIG. 3K is a schematic cross-sectional view of a stack structure of a light-emitting diode, according to an embodiment.

FIGS. 3A to 3J are schematic cross-sectional views of a state of the display apparatus 1 according to an embodiment, according to manufacturing processes; and FIG. 3K is a schematic cross-sectional view of a stack structure of a light-emitting diode according to an embodiment.

Referring to FIG. 3A, the subpixel circuit PC may be formed on a substrate 100. The substrate 100 may include glass or a polymer resin. The substrate 100 may include a stack structure including a base layer, which includes a polymer resin, and an inorganic barrier layer. The polymer resin may include polyethylenesulphone, polyacrylate (PAR), polyetherimide (PEI), polyethylene naphthalate (PEN), polyethylene terephthalate (PET), polyphenylene sulfide (PPS), polyarylate, polyimide (PI), polycarbonate, cellulose triacetate (TAC), and cellulose acetate propionate (CAP).

A buffer layer 101 may be disposed on a top surface (or upper surface) of the substrate 100. The buffer layer 101 may prevent impurities from permeating into a semiconductor layer of a transistor. The buffer layer 101 may include an inorganic insulating material such as silicon nitride, silicon oxynitride, and silicon oxide, and may include a single layer or multiple layers including the aforementioned inorganic insulating materials.

The subpixel circuit PC may be disposed on the buffer layer 101. As shown in FIGS. 2A and 2B above, the subpixel circuit PC may include a plurality of transistors and a storage capacitor. According to an embodiment, FIG. 3A illustrates the first transistor T1, the sixth transistor T6, and the storage capacitor Cst of the subpixel circuit PC.

The first transistor T1 may include a first semiconductor layer A1 on the buffer layer 101 and a first gate electrode G1 overlapping a channel area of the first semiconductor layer A1. The first semiconductor layer A1 may include an oxide semiconductor material, for example, polysilicon. The first semiconductor layer A1 may include a channel area, and first and second areas arranged at two sides of the channel area. The first and second areas include impurities having higher concentrations to those of the channel area. One of the first and second areas may include a source area, and the other may correspond to a drain area.

The sixth transistor T6 may include a sixth semiconductor layer A6 on the buffer layer 101 and the sixth gate electrode G6 overlapping the channel area of the sixth semiconductor layer A6. The sixth semiconductor layer A6 may include an oxide semiconductor material, for example, polysilicon. The sixth semiconductor layer A6 may include a channel area, and first and second areas arranged at two sides of the channel area. The first and second areas include impurities having higher concentrations to those of the channel area. One of the first and second areas may include a source area, and the other may correspond to a drain area.

The first gate electrode G1 and the sixth gate electrode G6 may include a conductive material including molybdenum (Mo), aluminum (Al), copper (Cu), titanium (Ti), and the like, and may include a single-layer structure or multi-layer structure including the aforementioned materials. A first gate insulating layer 103 for electrical insulation from the first semiconductor layer A1 and the sixth semiconductor layer A6 may be disposed under the first gate electrode G1 and the sixth gate electrode G6. The first gate insulating layer 103 may include an inorganic insulating material such as silicon nitride, silicon oxynitride, and silicon oxide, and may include a single layer or multiple layers including the aforementioned inorganic insulating materials.

The storage capacitor Cst may include the lower electrode CE1 and the upper electrode CE2 overlapping each other. According to an embodiment, the lower electrode CE1 of the storage capacitor Cst may include the first gate electrode G1. For example, the first gate electrode G1 may include the lower electrode CE1 of the storage capacitor Cst. For example, the first gate electrode G1 and the lower electrode CE1 of the storage capacitor Cst may be integral with each other.

A first interlayer insulating layer 105 may be disposed between the lower electrode CE1 and the upper electrode CE2 of the storage capacitor Cst. The first interlayer insulating layer 105 may include an inorganic insulating material such as silicon oxide, silicon nitride, and silicon oxynitride, and may include a single-layer structure or multi-layer structure including the aforementioned inorganic insulating materials.

The upper electrode CE2 of the storage capacitor Cst may include a low-resistance conductive material such as Mo, A1, Cu, and/or T1, and may include a single-layer structure or multi-layer structure including the aforementioned materials.

A second interlayer insulating layer 107 may be disposed on the storage capacitor Cst. The second interlayer insulating layer 107 may include an inorganic insulating material such as silicon oxide, silicon nitride, and silicon oxynitride, and may include a single-layer structure or multi-layer structure including the aforementioned inorganic insulating material.

A source electrode S1 and/or a drain electrode D1 connected (e.g., electrically connected) to the first semiconductor layer A1 of the first transistor T1 may be disposed on the second interlayer insulating layer 107. A source electrode S6 and/or a drain electrode D6 connected (e.g., electrically connected) to the sixth semiconductor layer A6 of the sixth transistor T6 may be disposed on the second interlayer insulating layer 107. The source electrodes S1 and S6 and/or the drain electrodes D1 and D6 may include A1, Cu, and/or T1, and may include a single layer or multi-layer including the aforementioned materials.

A first organic insulating layer 109 may be disposed on the subpixel circuit PC. The first organic insulating layer 109 may include an organic insulating material such as acryl, Benzocyclobutene (BCB), polyimide, or Hexamethyldisiloxane (HMDSO).

A contact metal CM may be disposed above the first organic insulating layer 109. The contact metal CM may include A1, Cu, and/or T1, and may include a single layer or multi-layer including the aforementioned materials.

A second organic insulating layer 111 may be disposed between the contact metal CM and a subpixel electrode 210. The second organic insulating layer 111 may include an organic insulating material such as acryl, BCB, polyimide, HMDSO, or the like. According to the embodiment described with reference to FIG. 3A, it is illustrated that the subpixel circuit PC and the subpixel electrode 210 are connected (e.g., electrically connected) to each other through the contact metal CM. However, according to another embodiment, the contact metal CM may be omitted, and one organic insulating layer may be between the subpixel circuit PC and the subpixel electrode 210. For example, three or more organic insulating layers may be between the subpixel circuit PC and the subpixel electrode 210, and the subpixel circuit PC and the subpixel electrode 210 may be connected (e.g., electrically connected) to each other through a plurality of contact metals.

The subpixel electrode 210 may be formed on the second organic insulating layer 111. The subpixel electrode 210 may be formed into a semi-transparent (or transparent) electrode or a reflective electrode. In case that the subpixel electrode 210 is formed into a semi-transparent (or transparent) electrode, it may include, for example, indium tin oxide (ITO), indium zinc oxide (IZO), zinc oxide (ZnO), indium oxide ($In_2O_3$), indium gallium oxide (IGO), or aluminum zinc oxide (AZO). In case that the subpixel electrode 210 is formed into a reflective electrode, a reflective film including Ag, Mg, A1, Pt, Pd, Au, Ni, Nd, Ir, Cr, or combinations thereof may be formed, and a film including ITO, IZO, ZnO, and $In_2O_3$ may be formed on the reflective film. According to an embodiment, the subpixel electrode 210 may have a structure in which an ITO layer, an Ag layer, and an ITO layer are sequentially stacked. The subpixel electrode 210 may be connected (e.g., electrically connected) to the contact metal CM through a contact hole of the second organic insulating layer 111.

A protective layer 113 may be formed on the subpixel electrode 210. The protective layer 113 may be formed together with the subpixel electrode 210. For example, the subpixel electrode 210 and the protective layer 113 may be formed by using a same mask. The protective layer 113 may prevent the subpixel electrode 210 from being damaged due to a gas or liquid material used in various etching processes or ashing processes included in a process of manufacturing the display apparatus. The protective layer 113 may include a conductive oxide material (e.g., transparent conductive oxide material) such as ITO, IZO, indium gallium zinc oxide (IGZO), indium tin zinc oxide (ITZO), ZnO, aluminum-doped zinc oxide (AZO), gallium-doped zinc oxide (GZO), ZTO, GTO, fluorine-doped tin oxide (FTO), and the like.

Referring to FIG. 3B, an insulating layer 115 may be formed on a structure as shown in FIG. 3A. The insulating layer 115 may be formed on an entire area of the substrate 100. For example, the insulating layer 115 may overlap the subpixel electrode 210 and the protective layer 113. The insulating layer 115 may contact (e.g., directly contact) a part of a top surface (or upper surface) of the second organic insulating layer 111 in which the subpixel electrode 210 and the protective layer 113 do not exist. The insulating layer 115 may cover side surfaces of each of the subpixel electrode 210 and the protective layer 113. The insulating layer 115 may include an organic material layer. Compared with the insulating layer 115 including an organic insulating material, in case that the insulating layer 115 includes an inorganic insulating material, degradation in quality of the light-emitting diode due to gas discharged from the insulating layer including an organic material in the process of manufacturing the display apparatus may be prevented or minimized.

The insulating layer 115 may include an inorganic insulating material such as silicon oxide, silicon nitride, and silicon oxynitride, and may include a single-layer structure or multi-layer structure including the aforementioned inorganic insulating material. According to an embodiment, the insulating layer 115 may include a double-layer structure including a silicon oxide layer and a silicon nitride layer. A thickness of the silicon oxide layer may be smaller than a thickness of the silicon nitride layer. In some embodiments, a thickness of the insulating layer 115 may be greater than a thickness of the protective layer 113. For example, the thickness of the insulating layer 115 may be about 1000 Å and the thickness of the protective layer 113 may be about 500 Å, but embodiments are not limited thereto.

Referring to FIG. 3C, a metal bank layer 300 may be formed on the insulating layer 115 shown in FIG. 3B. The metal bank layer 300 may include a first metal layer 310 and a second metal layer 320 on the first metal layer 310.

The first metal layer 310 and the second metal layer 320 may include different metals, respectively. For example, the first metal layer 310 and the second metal layer 320 may include metals having different etching selectivity ratios. According to an embodiment, the first metal layer 310 may include a layer including A1, and the second metal layer 320 may include a layer including T1.

A thickness of the first metal layer 310 may be greater than a thickness of the second metal layer 320. According to an embodiment, a thickness of the first metal layer 310 may be greater than five times of the thickness of the second metal layer 320. According to another embodiment, the thickness of the first metal layer 310 may be greater than about six times, about seven times, or about eight times of the thickness of the second metal layer 320. According to an embodiment, the thickness of the first metal layer 310 may be in a range of about 4000 Å to about 8000 Å, and the thickness of the second metal layer 320 may be in a range of about 500 Å to about 800 Å. The thickness of the first metal layer 310 may be equal to or greater than about four times, about five times, or about six times of the thickness of the insulating layer 115.

Referring to FIG. 3D, a photoresist PR may be formed on the metal bank layer 300. The photoresist PR may include an opening overlapping the subpixel electrode 210 and the protective layer 113. A portion of a top surface (or upper surface) of the metal bank layer 300 may be exposed through the opening of the photoresist PR.

Referring to FIG. 3E, a portion of the metal bank layer 300, e.g., a portion of the second metal layer 320 and a portion of the first metal layer 310, may be removed by using the photoresist PR as a mask. For example, the portion of the second metal layer 320 and the portion of the first metal layer 310 may be sequentially removed through the opening of the photoresist PR. The portion of the second metal layer 320 and the portion of the first metal layer 310 may be removed by a dry etching process. In an etching process, the insulating layer 115 and the protective layer 113 may protect the subpixel electrode 210 under the insulating layer 115 and the protective layer 113.

By an etching process, an opening 320OP1 may be formed in the second metal layer 320. The opening 320OP1 may overlap the subpixel electrode 210 and the protective layer 113, and may penetrate through a bottom surface (or lower surface) of the second metal layer 320 from a top surface (or upper surface) of the second metal layer 320. An opening 310OP1 may be formed in the first metal layer 310. The opening 310OP1 may overlap the subpixel electrode 210 and the protective layer 113 and may penetrate through a bottom surface (or lower surface) of the first metal layer 310 from a top surface of the first metal layer 310.

Referring to FIG. 3F, an undercut-shaped opening OP may be formed in the metal bank layer 300, by using the photoresist PR as a mask.

For example, a portion of the first metal layer 310 may be further etched by using the photoresist PR as a mask, and an opening 310OP2 having a width greater than a width of the opening 310OP1 of the first metal layer 310 formed in the process shown in FIG. 3E may be formed in the first metal layer 310. In some embodiments, the opening 310OP2 of the first metal layer 310 may have a shape in which a width decreases toward a bottom surface (or lower surface) of the first metal layer 310. For example, a width of a top portion (or upper portion) of the opening 310OP2 of the first metal layer 310 may be greater than a width of a bottom portion (or lower portion) of the opening 310OP2 of the first metal layer 310. For example, the side surface of the first metal layer 310 facing the opening 310OP2 may include a slope tapered in a positive direction.

In some embodiments, the undercut-shaped opening OP may be formed in the metal bank layer 300 by a wet etching process. For example, the opening 310OP2 of the first metal layer 310 may be formed by a wet etching process. The first metal layer 310 and the second metal layer 320 include metals having different etching selectivity ratios, and therefore, in a wet etching process, a portion of the first metal layer 310 may be removed, and the opening 310OP2 of the first metal layer 310, which has a width greater than the width of the opening 320OP1 of the second metal layer 320, may be formed. In the wet etching process for forming the opening 310OP2 of the first metal layer 310, the insulating layer 115 and the protective layer 113 may protect the subpixel electrode 210 under the insulating layer 115 and the protective layer 113.

The opening 310OP2 of the first metal layer 310 may have a great diameter in a state of overlapping the opening 320OP1 of the second metal layer 320, and therefore, the second metal layer 320 may have a first protruding portion (or first tip portion) PT1.

A portion of the second metal layer 320 defining the opening 320OP1 of the second metal layer 320 may protrude toward the opening 320OP1 from a point CP at which a side surface of the first metal layer 310 facing the opening 310OP2 of the first metal layer 310 meets a bottom surface (or lower surface) of the second metal layer 320, and may form an undercut structure. The portion of the second metal layer 320 further protruding toward the opening 320OP1 may correspond to the first protruding portion PT1. A length of the first protruding portion PT1, e.g., a length "a" from the aforementioned point CP to an edge portion (or a side surface) of the first protruding portion PT1 may be equal to or less than about 2 μm. In some embodiments, the length of the first protruding portion PT1 of the second metal layer 320 may be in a range of about 0.3 μm to about 1 μm, or in a range of about 0.3 μm to about 0.7 μm.

A slope angle (e.g., a slope angle θ of the side surface of the first metal layer 310 with respect to an imaginary line IML parallel to the top surface (or upper surface) of the substrate 100) of a side surface of the first metal layer 310 tapered in a positive direction facing the opening 310OP2 of the first metal layer 310 may be equal to or greater than about 60° and may be smaller than about 90°.

Referring to FIG. 3G, a portion of the insulating layer 115 may be removed by using the photoresist PR as a mask. The portion of the insulating layer 115 may be removed by a dry etching process. A width of an opening 115OP1 of the insulating layer 115 may be substantially identical to a width of an opening area of the photoresist PR and/or a width of a top portion (or upper portion) of the opening OP of the metal bank layer (e.g., a width of the opening 320OP1 of the second metal layer 320).

For example, the width of the opening 115OP1 of the insulating layer 115 may be smaller than a width of the bottom surface (or lower surface) of the first metal layer 310. A lower portion of the side surface of the first metal layer 310 (e.g., a point at which the side surface of the first metal layer 310 meets the bottom surface (or lower surface) of the first metal layer 310) may meet a top surface (or upper surface) of the insulating layer 115.

Referring to FIG. 3H, a portion of the protective layer 113 may be removed by using the photoresist PR as a mask. The portion of the protective layer 113 may be removed by a wet etching process, and the subpixel electrode 210 may be exposed through an opening 113OP1 of the protective layer 113. A width of the opening 113OP1 of the protective layer 113 formed in case that the portion of the protective layer 113 is removed may be greater than the width of the opening 115OP1 of the insulating layer 115. For example, the edge portion (or the side surface) of the protective layer 113 defining the opening 113OP1 of the protective layer 113 may be under the insulating layer 115.

For example, the photoresist PR may be removed.

Referring to FIG. 3I, the intermediate layer 220 and the counter electrode 230 may be formed to overlap the subpixel electrode 210 on the structure shown in FIG. 3H, from which the photoresist PR has been removed. A stack structure including the subpixel electrode 210, the intermediate layer 220, and the counter electrode 230 may correspond to the light-emitting diode ED. In some embodiments, the intermediate layer 220 and the counter electrode 230 may each be formed by a deposition method such as a thermal deposition process.

As shown in FIG. 3K, the intermediate layer 220 may include an emission layer 222. The intermediate layer 220 may include common layers between the subpixel electrode 210 and the emission layer 222 and/or between the emission layer 222 and the counter electrode 230. Hereinafter, the common layer between the subpixel electrode 210 and the emission layer 222 will be referred to as a first common layer 221, and the common layer between the emission layer 222 and the counter electrode 230 will be referred to as a second common layer 223.

The emission layer 222 may include high-molecular organic material or a low-molecular organic material emitting light of certain colors (e.g., red, green, or blue). According to another embodiment, the emission layer 222 may include an inorganic material or quantum dots.

The first common layer 221 may include a hole transport layer (HTL) and/or a hole injection layer (HIL). The second common layer 223 may include an electron transport layer (ETL) and/or an electron injection layer (EIL). The first common layer 221 and the second common layer 223 may include organic materials.

The intermediate layer 220 may have a single-stack structure including a single emission layer or a tandem structure, which is a multi-stack structure including a plurality of emission layers. In case that the intermediate layer 220 has the tandem structure, a charge generation layer (CGL) may be arranged between a plurality of stacks.

The counter electrode 230 may include a conductive material having a small work function. For example, the counter electrode 230 may include a semi-transparent (e.g., transparent) layer including Ag, Mg, Al, Pt, Pd, Au, Ni, Nd, Jr, Cr, Li, Ca, or alloys thereof. In another example, the counter electrode 230 may further include a layer including ITO, IZO, ZnO, or $In_2O_3$ on the semi-transparent (or transparent) layer including the aforementioned material.

Referring again to FIG. 3I, the intermediate layer 220 may overlap and be in contact with the subpixel electrode 210 through the opening OP of the metal bank layer 300, an opening 115OP1 of the insulating layer 115, and the opening 113OP1 of the protective layer 113. A width of an emission area of the light-emitting diode ED may be substantially identical to a width of the opening 115OP1 of the insulating layer 115.

As the intermediate layer 220 and the counter electrode 230 are deposited without using a mask, a deposition material for forming the intermediate layer 220 and a deposition material for forming the counter electrode 230 may respectively form a dummy intermediate layer 220*b* and a dummy counter electrode 230*b* on the metal bank layer 300. The intermediate layer 220 and the dummy intermediate layer 220*b* may be separate and spaced apart from each other, and the counter electrode 230 and a dummy counter electrode 230*b* may be separate and spaced apart from each other. The intermediate layer 220 and the dummy intermediate layer 220*b* may include a same material and/or a same number of sublayers (e.g., the first common layer, the emission layer, and the second common layer). The counter electrode 230 and the dummy counter electrode 230*b* may include a same material.

An edge portion or an outer portion (or a peripheral portion) of the counter electrode 230 may extend beyond an edge portion or an outer portion (or a peripheral portion) of the intermediate layer 220 and may contact (e.g., directly contact) the side surface of the first metal layer 310. The first metal layer 310 and the counter electrode 230 may be connected (e.g., electrically connected) to each other. In the description, the term "the outer portion (or the peripheral portion) of the counter electrode 230" indicates "a portion of the counter electrode 230 including the edge portion of the counter electrode 230".

Referring to FIG. 3J, an encapsulation layer 500 may be formed on the light-emitting diode ED. The encapsulation layer 500 may include at least one inorganic encapsulation layer and at least one organic encapsulation layer. According to an embodiment, FIG. 3J illustrates that the encapsulation layer 500 includes a first inorganic encapsulation layer 510, an organic encapsulation layer 520 on the first inorganic encapsulation layer 510, and a second inorganic encapsulation layer 530 on the organic encapsulation layer 520.

The first inorganic encapsulation layer 510 and the second inorganic encapsulation layer 530 may include one or more inorganic materials from among aluminum oxide, titanium oxide, tantalum oxide, hafnium oxide, zinc oxide, silicon oxide, silicon nitride, and/or silicon oxynitride, and may be deposited in a scheme such as a chemical vapor deposition method. The first inorganic encapsulation layer 510 and the second inorganic encapsulation layer 530 may include a single layer or multiple layers including the aforementioned materials. The organic encapsulation layer 520 may include a polymer-based material. The polymer-based material may include an acryl-based resin, an epoxy-based resin, polyimide, and polyethylene. According to an embodiment, the organic encapsulation layer 520 may include acrylate.

The first inorganic encapsulation layer 510, which has relatively better step coverage, may cover at least a portion of an inner surface of the opening OP of the metal bank layer 300 having the undercut structure. In an embodiment, the first inorganic encapsulation layer 510 may be consecutively formed to overlap (or cover) a top surface (or upper surface) and side surfaces of the dummy counter electrode 230*b*, side surfaces of the dummy intermediate layer 220*b*, side surfaces and a bottom surface (or lower surface) of the second metal layer 320, side surfaces of the first metal layer 310, and a top surface (or upper surface) of the counter electrode 230.

The organic encapsulation layer 520 may be on the first inorganic encapsulation layer 510 and may fill at least a portion of the opening OP of the metal bank layer 300. The second inorganic encapsulation layer 530 may be disposed on the organic encapsulation layer 520.

In the embodiments shown in FIGS. 3A through 3J, it is illustrated that the metal bank layer 300 includes the first metal layer 310 and the second metal layer 320 on the first metal layer 310, but embodiments are not limited thereto. According to another embodiment, the metal bank layer 300 may include the first metal layer 310, the second metal layer 320 on the first metal layer 310, and a third metal layer under the first metal layer 310, and the third metal layer may include a material substantially identical to or different from the material included in the first metal layer 310.

Figure 4:
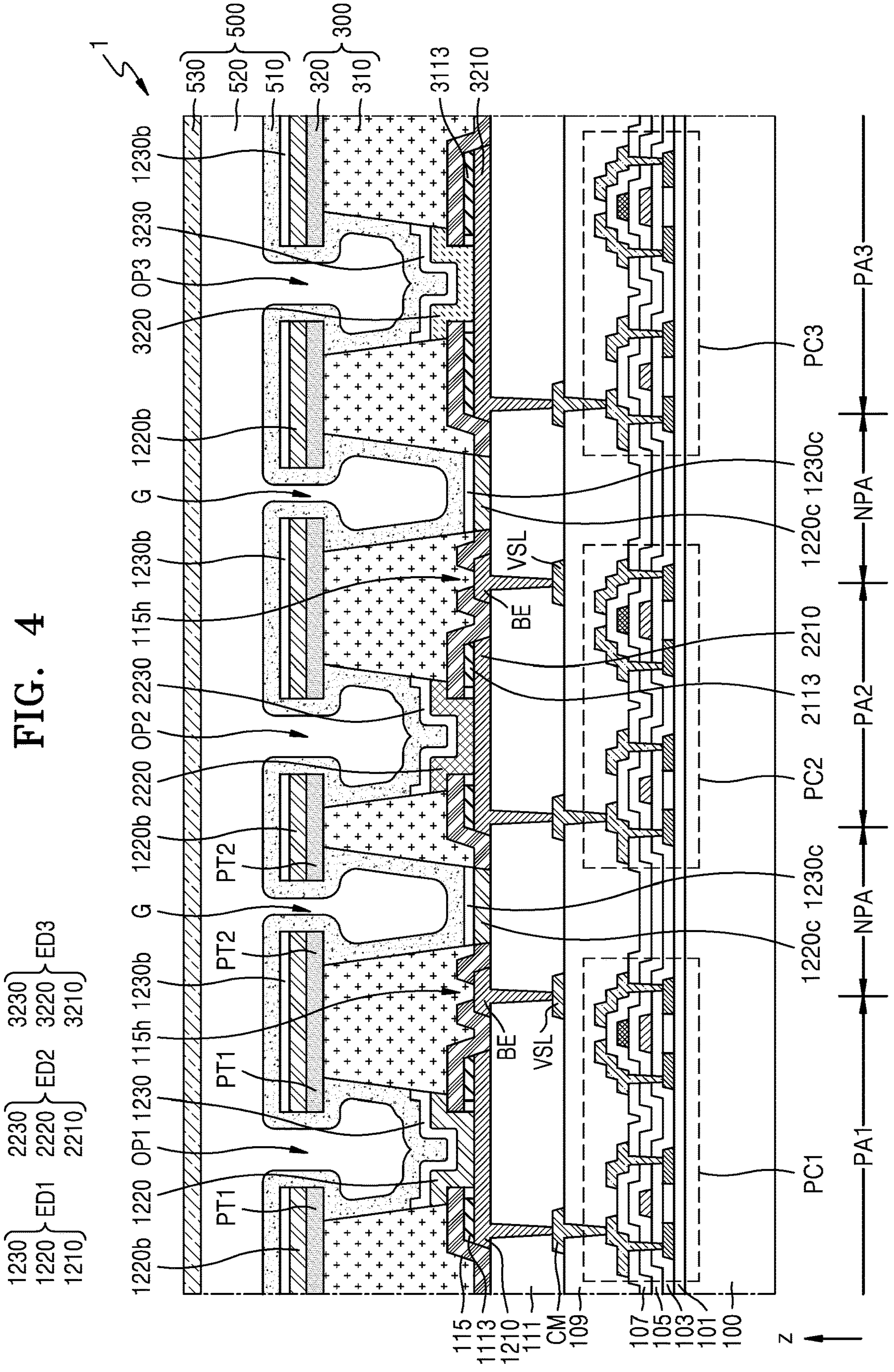
FIG. 4 is a schematic cross-sectional view of a display apparatus according to an embodiment.
Figure 5:
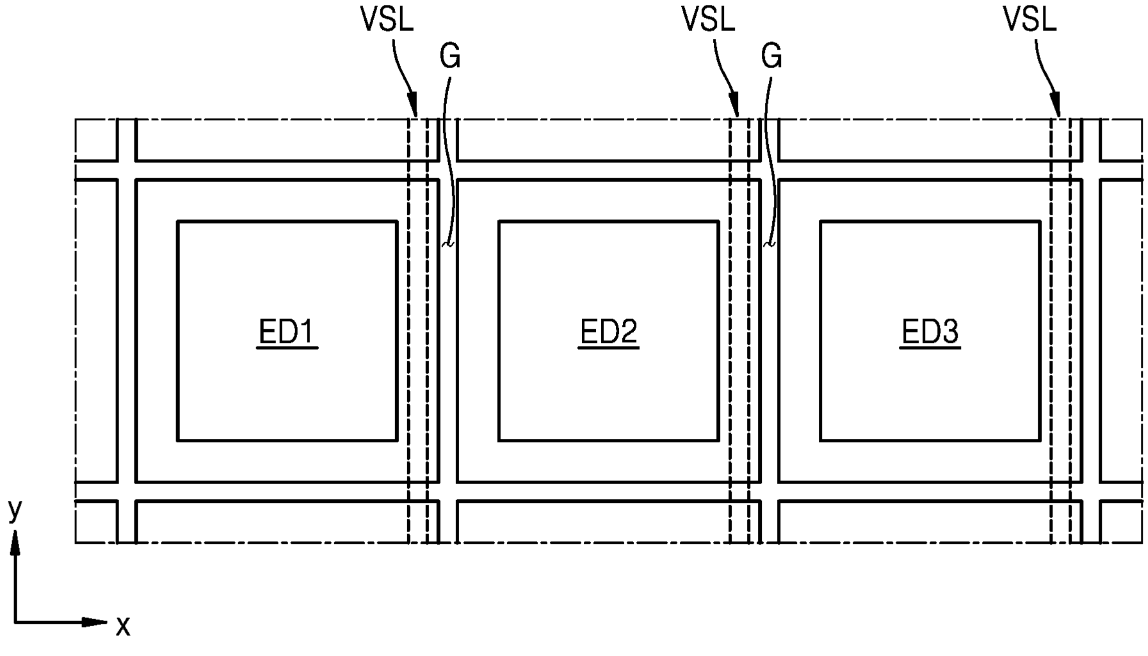
FIG. 5 is a schematic top-plan view of grooves and auxiliary conductive layers of a display apparatus according to an embodiment.

FIG. 4 is a schematic cross-sectional view of the display apparatus 1 according to an embodiment, and FIG. 5 is a schematic top-plan view of grooves G and auxiliary conductive layers VSL of the display apparatus according to an embodiment.

Referring to FIG. 4, the display apparatus 1 may include a first subpixel area PA1, a second subpixel area PA2, and a third subpixel area PA3 and a non-subpixel area NPA between the subpixel areas neighboring one another. A planar surface of the display apparatus 1 may be substantially identical to a planar shape of the substrate 100. Therefore, the display apparatus 1 includes the first subpixel area PA1, the second subpixel area PA2, the third subpixel area PA3, and the non-subpixel area NPA may indicate that the substrate 100 includes the first subpixel area PA1, the second subpixel area PA2, the third subpixel area PA3, and the non-subpixel area NPA.

A first light-emitting diode ED1, a second light-emitting diode ED2, and a third light-emitting diode ED3 may be respectively disposed above the substrate 100. The first to third light-emitting diodes ED1, ED2, and ED3 may be respectively arranged in the first subpixel area PA1, the second subpixel area PA2, and the third subpixel area PA3.

A first subpixel circuit PC1, a second subpixel circuit PC2, and a third subpixel circuit PC3 may be disposed between the substrate 100 and the first light-emitting diode ED1, the second light-emitting diode ED2, and the third light-emitting diode ED3. The first subpixel circuit PC1, the second subpixel circuit PC2, and the third subpixel circuit PC3 may each include a transistor and a storage capacitor as described above with reference to FIG. 2A or FIG. 2B. In an embodiment, FIG. 4 illustrates that the first subpixel circuit PC1, the second subpixel circuit PC2, and the third subpixel circuit PC3 each include the same structure as the subpixel circuit PC (see FIG. 3) described with reference to FIG. 3A, and detailed structures of the first subpixel circuit PC1, the second subpixel circuit PC2, and the third subpixel circuit PC3 are as described above.

The first light-emitting diode ED1, the second light-emitting diode ED2, and the third light-emitting diode ED3, which are connected (e.g., electrically connected) to the first subpixel circuit PC1, the second subpixel circuit PC2, and the third subpixel circuit PC3, respectively, may each have a stack structure including a subpixel electrode, an intermediate layer, and a counter electrode.

For example, the first light-emitting diode ED1 may include a first subpixel electrode 1210, a first intermediate layer 1220, and a first counter electrode 1230. The first subpixel electrode 1210 may be connected (e.g., electrically connected) to the first subpixel circuit PC1. The second light-emitting diode ED2 may include a second subpixel electrode 2210, a second intermediate layer 2220, and a second counter electrode 2230. The second subpixel electrode 2210 may be connected (e.g., electrically connected) to the second subpixel circuit PC2. The third light-emitting diode ED3 may include a third subpixel electrode 3210, a third intermediate layer 3220, and a third counter electrode 3230. The third subpixel electrode 3210 may be connected (e.g., electrically connected) to the third subpixel circuit PC3.

As described above with reference to FIG. 3K, the first intermediate layer 1220, the second intermediate layer 2220, and the third intermediate layer 3220 may each include an emission layer and a first common layer and/or second common layer, and detailed structures and materials thereof are as described above. For example, the emission layer of the first intermediate layer 1220, the emission layer of the second intermediate layer 2220, and the emission layer of the third intermediate layer 3220 may emit light of different colors, respectively.

Each of the first subpixel electrode 1210, the second subpixel electrode 2210, and the third subpixel electrode 3210 may include an inner portion and an outer portion surrounding the inner portion. In the description, the phrase "an outer portion (or a peripheral portion) of a subpixel electrode" indicates "a portion of a subpixel electrode including an edge portion of the subpixel electrode", and the phrase "an inner portion of a subpixel electrode" indicates "another portion of the subpixel electrode surrounded by the outer portion (or the peripheral portion) described above".

The first intermediate layer 1220 may overlap or contact the inner portion of the first subpixel electrode 1210, on the inner portion of the first subpixel electrode 1210, and the first counter electrode 1230 may overlap a top surface (or upper surface) of the first intermediate layer 1220. The insulating layer 115 may be disposed on the outer portion of the first subpixel electrode 1210. The insulating layer 115 may overlap the outer portion of the first subpixel electrode 1210, and may extend over the second organic insulating layer 111 to cover the side surface of the first subpixel electrode 1210. A first protective layer 1113 may be disposed between the insulating layer 115 and the outer portion of the first subpixel electrode 1210. The insulating layer 115 and the first protective layer 1113 may be on the outer portion of the first subpixel electrode 1210, and are not on the inner portion of the first subpixel electrode 1210. For example, the insulating layer 115 and the first protective layer 1113 may each include an opening overlapping the inner portion of the first subpixel electrode 1210.

For example, the second intermediate layer 2220 may overlap and contact an inner portion of the second subpixel electrode 2210, on the inner portion of the second subpixel electrode 2210, and the second counter electrode 2230 may overlap a top surface (or upper surface) of the second intermediate layer 2220. An outer portion of the second subpixel electrode 2210 may overlap the insulating layer 115. The third intermediate layer 3220 may overlap and contact an inner portion of the third subpixel electrode 3210, on the inner portion of the third subpixel electrode 3210, and the third counter electrode 3230 may overlap a top surface (or upper surface) of the third intermediate layer 3220. An outer portion of the third subpixel electrode 3210 may overlap the insulating layer 115. The insulating layer 115 may overlap the outer portions of the second subpixel electrode 2210 and the third subpixel electrode 3210, and may extend over the second organic insulating layer 111 to cover the side surfaces of the second subpixel electrode 2210 and the third subpixel electrode 3210. A second protective layer 2113 may be disposed between the insulating layer 115 and the outer portion of the second subpixel electrode 2210, and a third protective layer 3113 may be disposed between the insulating layer 115 and the outer portion of the third subpixel electrode 3210.

The metal bank layer 300 may include a first opening OP1, a second opening OP2, and a third opening OP3 respectively overlapping the first subpixel electrode 1210, the second subpixel electrode 2210, and the third subpixel electrode 3210. The first opening OP1, the second opening OP2, and the third opening OP3 of the metal bank layer 300 shown in FIG. 4 have a same structure as the opening OP (see FIG. 3F) described above with reference to FIG. 3F.

For example, the first opening OP1, the second opening OP2, and the third opening OP3 may each penetrate through the bottom surface (or lower surface) of the metal bank layer 300 from the top surface (or upper surface) of the metal bank layer 300, and may have an undercut-shaped cross-section structure. The side surface of the first metal layer 310 facing a corresponding opening from the first opening OP1, the second opening OP2, and the third opening OP3 of the metal bank layer 300 may have a shape tapered in a positive direction, and may have a slope angle equal to or greater than about 60° and smaller than about 90°. The second metal layer 320 of the metal bank layer 300 may include the first protruding portion PT1 extending toward a corresponding opening from among the first opening OP1, the second opening OP2, and the third opening OP3. The length of the first protruding portion PT1 may be equal to or smaller than about 2 In some embodiments, the length of the first protruding portion PT1 may be in a range of about 0.3 μm to about 1 μm, or in a range of about 0.3 μm to about 0.7 μm.

Bus electrodes BE may be arranged adjacent to the first subpixel electrode 1210, the second subpixel electrode 2210, and the third subpixel electrode 3210, respectively. The bus electrodes BE, the first subpixel electrode 1210, the second subpixel electrode 2210, and the third subpixel electrode 3210 may be arranged on a same layer (for example, the second organic insulating layer 111). The bus electrodes BE, the first subpixel electrode 1210, the second subpixel electrode 2210, and the third subpixel electrode 3210 may include a same material. For example, in case that the first subpixel electrode 1210, the second subpixel electrode 2210, and the third subpixel electrode 3210 each have a three-layer structure including an ITO layer, an Ag layer, and an ITO layer, the bus electrodes BE may also have a three-layer structure including an ITO layer, an Ag layer, and an ITO layer.

The bus electrode BE may contact (e.g., electrically contact) the auxiliary conductive layer VSL disposed under the bus electrode BE, with an insulating layer (e.g., the second organic insulating layer 111) therebetween. The auxiliary conductive layer VSL and the contact metal CM may be arranged on a same layer, and may include a same material. The auxiliary conductive layer VSL may include A1, Cu, and/or T1, and may include a single layer or multiple layers including the aforementioned materials. The auxiliary conductive layer VSL may extend in a direction (e.g., the y direction) as shown in FIG. 5.

As shown in FIG. 4, the bus electrode BE is illustrated as being arranged between neighboring light-emitting diodes or between neighboring subpixel electrodes. For example, the bus electrode BE may be arranged between the first subpixel electrode 1210 and the second subpixel electrode 2210, between the second subpixel electrode 2210 and the third subpixel electrode 3210, and between the first subpixel electrode 1210 and the third subpixel electrode 3210. The bus electrode BE may be connected to the auxiliary conductive layer VSL through a contact hole penetrating the second organic insulating layer 111, and thus may have a voltage level substantially identical to a voltage level of the auxiliary conductive layer VSL. The auxiliary conductive layer VSL may extend in a direction (e.g., the y direction) as shown in FIG. 5, and thus may cross a groove G in a plan view. Different from the auxiliary conductive layer VSL extending in a direction (e.g., the y direction), the bus electrode BE may have an isolated shape (or an island shape) in a plan view and may not cross the groove G. According to another embodiment, like the auxiliary conductive layer VSL, the bus electrode BE may extend in a direction (e.g., the y direction).

The metal bank layer 300 may be connected (e.g., electrically connected) to the bus electrode BE. For example, a bottom surface (or lower surface) of the metal bank layer 300 may contact (e.g., directly contact) a portion of a top surface (or upper surface) of the bus electrode BE. As shown in FIG. 4, the insulating layer 115 may include a contact hole **115*h* exposing a portion of the top surface (or upper surface) of the bus electrode BE. The bottom surface (or lower surface) of the metal bank layer 300, e.g., a bottom surface (or lower surface) of the first metal layer 310, may contact (e.g., directly contact) the portion of the top surface (or upper surface) of the bus electrode BE through the contact hole 115*h* of the insulating layer 115**.

In the display apparatus 1 according to an embodiment, a deposition process may be performed without using a mask in case that forming the first intermediate layer 1220, the second intermediate layer 2220, and the third intermediate layer 3220 and the first counter electrode 1230, the second counter electrode 2230, and the third counter electrode 3230, due to the structure of the metal bank layer 300 including the first opening OP1, the second opening OP2, and the third opening OP3 having the undercut structure. Accordingly, damage of the display apparatus 1 due to the mask may be prevented.

As a material for forming the intermediate layers and a material for forming the counter electrodes are deposited without using masks, the material for forming the intermediate layers and the material for forming the counter electrodes may be deposited in a corresponding opening from among the first opening OP1, the second opening OP2, and the third opening OP3, and may be deposited on the metal bank layer 300. At least one dummy intermediate layer and at least one dummy counter electrode may be disposed above the metal bank layer 300. The at least one dummy intermediate layer may be separate and spaced apart from the first intermediate layer 1220, the second intermediate layer 2220, and the third intermediate layer 3220 respectively in the first opening OP1, the second opening OP2, and the third opening OP3. The at least one dummy counter electrode may be separate and spaced apart from the first counter electrode 1230, the second counter electrode 2230, and the third counter electrode 3230 respectively in the first opening OP1, the second opening OP2, and the third opening OP3. According to an embodiment, FIG. 4 illustrates dummy portions 1220*b* and 1220*c* corresponding to a first dummy intermediate layer and dummy electrode portions 1230*b* and 1230*c* corresponding to a first dummy counter electrode.

As the first dummy intermediate layer includes an organic material, in a process of manufacturing the display apparatus 1, unintended impurities (e.g., a material used in an ashing process on the photoresist) may move (or permeate) through the first dummy intermediate layer. To prevent the impurities moving (or permeating) through the first dummy intermediate layer from progressing toward the first light-emitting diode ED1, the second light-emitting diode ED2, and the third light-emitting diode ED3, a groove G may be arranged between neighboring light-emitting diodes, for example, in a non-subpixel area NPA.

The groove G may have a concave shape with respect to (or from) the top surface (or upper surface) of the metal bank layer 300. Like the first opening OP1, the second opening OP2, and the third opening OP3, the groove G may have an undercut shape. A portion of the second metal layer 320 of the metal bank layer 300 may include a second protruding portion (or second tip portion) PT2 protruding toward the groove G. Although FIG. 4 illustrates that a bottom surface (or lower surface) of the groove G is substantially identical to a top surface (or upper surface) of the second organic insulating layer 111, embodiments are not limited thereto. The bottom surface (or lower surface) of the groove G may be at an opposite side of the top surface (or upper surface) of the substrate 100, with the top surface (or upper surface) of the second organic insulating layer 111 therebetween in the z direction. For example, a depth of the groove G according to an embodiment may be smaller than a depth of the groove G shown in FIG. 4. According to another embodiment, the depth of the groove G according to an embodiment may be greater than the depth of the groove G shown in FIG. 4.

Due to the undercut structure of the groove G and/or the second protruding portion PT2, the first dummy intermediate layer may include, in the non-subpixel area NPA, a plurality of dummy portions 1220*b* and 1220*c* that are separate from each other. A portion (hereinafter, referred to as a (1-1)th dummy portion) 1220*b* of the plurality of the dummy portions 1220*b* and 1220*c* may be disposed above the metal bank layer 300, and another portion (hereinafter, referred to as a (1-2)th dummy portion) 1220*c* may be in the groove G. The (1-1)th dummy portion 1220*b* and the (1-2)th dummy portion 1220*c* may be separate and spaced apart from each other. The (1-1)th dummy portion 1220*b* arranged at two sides (e.g., opposite sides) of the groove G with the groove G therebetween may also be separate and spaced apart from each other. In some embodiments, each of the (1-1)th dummy portion 1220*b* and the (1-2)th dummy portion 1220*c* may include a same material and/or a same number of sublayers as the first intermediate layer 1220.

Like the first dummy intermediate layer, due to the undercut structure of the groove G and/or the second protruding portion PT2, the first dummy counter electrode may include, in the non-subpixel area NPA, a plurality of dummy electrode portions 1230*b* and 1230*c* separate from each other. A portion (hereinafter, referred to as a (1-1)th dummy electrode portion) 1230*b* of the plurality of dummy electrode portions 1230*b* and 1230*c* may be disposed on the metal bank layer 300, and another portion (hereinafter, referred to as a (1-2)th dummy electrode portion) 1230*c* may be in the groove G. The (1-1)th dummy electrode portion 1230*b* and the (1-2)th dummy electrode portion 1230*c* may be separate and spaced apart from each other. The (1-1)th dummy electrode portions 1230*b* arranged at the two sides of the groove G, with the groove G therebetween, may also be separate and spaced apart from each other. In some embodiments, each of the (1-1)th dummy electrode portion 1230*b* and the (1-2)th dummy electrode portion 1230*c* may include a same material and/or a same number of sublayers as the first counter electrode 1230.

As shown in FIG. 5, the groove G may be formed to at least partially surround each of the first light-emitting diode ED1, the second light-emitting diode ED2, and the third light-emitting diode ED3. According to an embodiment, referring to FIGS. 4 and 5, each of the first light-emitting diode ED1, the second light-emitting diode ED2, and the third light-emitting diode ED3 may be surrounded (e.g., entirely surrounded) by the groove G. For example, the first subpixel electrode 1210, the first intermediate layer 1220, and the first counter electrode 1230 of the first light-emitting diode ED1 may each be surrounded (e.g., entirely surrounded) by the groove G in a plan view. For example, the second subpixel electrode 2210, the second intermediate layer 2220, and the second counter electrode 2230 of the second light-emitting diode ED2 may each be surrounded (e.g., entirely surrounded) by the groove G in a plan view. The third subpixel electrode 3210, the third intermediate layer 3220, and the third counter electrode 3230 of the third light-emitting diode ED3 may each be surrounded (e.g., entirely surrounded) by the groove G in a plan view.

As shown in FIG. 5, the grooves G may have a net structure connected to one another in a plan view. According to another embodiment, the groove G surrounding the first light-emitting diode ED1 and the groove G surrounding the second light-emitting diode ED2 may each have a closed loop shape separated from each other, without being connected to each other.

The first counter electrode 1230 arranged in the first opening OP1 of the metal bank layer 300, the second counter electrode 2230 arranged in the second opening OP2 of the metal bank layer 300, and the third counter electrode 3230 arranged in the third opening OP3 of the metal bank layer 300 may be spatially separate or spaced apart from one another. The first counter electrode 1230, the second counter electrode 2230, and the third counter electrode 3230 may be connected (e.g., electrically connected) to one another and may have a same voltage level. For example, the first counter electrode 1230, the second counter electrode 2230, and the third counter electrode 3230 may have a voltage level substantially identical to a level of a voltage (e.g., the common voltage) provided by the auxiliary conductive layer VSL.

The first counter electrode 1230, the second counter electrode 2230, and the third counter electrode 3230 may each be connected (e.g., electrically connected) to the bus electrode BE through the metal bank layer 300. The first counter electrode 1230, the second counter electrode 2230, and the third counter electrode 3230 may each be connected (e.g., electrically connected) to the auxiliary conductive layer VSL through the metal bank layer 300 and the bus electrode BE.

For example, an outer portion of the first counter electrode 1230 may be electrically connected to (e.g., may directly contact) the side surface of the metal bank layer 300 (e.g., the side surface of the first metal layer 310) facing the first opening OP1, the bottom surface (or lower surface) of the metal bank layer 300 may be electrically connected to (or may directly contact) a portion of the bus electrode BE, and the bus electrode BE may be electrically connected to (or may directly contact) the auxiliary conductive layer VSL through the contact hole of the second organic insulating layer 111.

An outer portion of the second counter electrode 2230 may be electrically connected to (or may directly contact) the side surface of the metal bank layer 300 (e.g., the side surface of the first metal layer 310) facing the second opening OP2, the bottom surface (or lower surface) of the metal bank layer 300 may be electrically connected to (or may directly contact) a portion of the bus electrode BE, and the bus electrode BE may be electrically connected to (or may directly contact) the auxiliary conductive layer VSL through the contact hole of the second organic insulating layer 111.

An outer portion of the third counter electrode 3230 may be electrically connected to (or may directly contact) a side surface of the metal bank layer 300 facing the third opening OP3, the bottom surface (or lower surface) of the metal bank layer 300 may be electrically connected to (or may directly contact) a portion of the bus electrode BE, and the bus electrode BE may be electrically connected to (or may directly contact) the auxiliary conductive layer VSL through the contact hole of the second organic insulating layer 111.

The first counter electrode 1230, the second counter electrode 2230, and the third counter electrode 3230 may be connected (e.g., electrically connected) to one another through the dummy electrode portions in the metal bank layer 300 and the groove G. The outer portion of the first counter electrode 1230 may contact (e.g., directly contact) the side surface of the metal bank layer 300 facing the first opening OP1 (e.g., the side surface of the first metal layer 310), an outer portion of the (1-2)th dummy electrode portion 1230*c* in the groove G between the first counter electrode 1230 and the second counter electrode 2230 may contact (e.g., directly contact) a side surface of the metal bank layer 300 facing the groove G (e.g., the side surface of the first metal layer 310), and the outer portion of the second counter electrode 2230 may contact (e.g., directly contact) the side surface of the metal bank layer 300 facing the second opening OP2 (e.g., the side surface of the first metal layer 310).

The outer portion of the second counter electrode 2230 may contact (e.g., directly contact) the side surface of the metal bank layer 300 facing the second opening OP2 (e.g., the side surface of the first metal layer 310), an outer portion of the (1-2)th dummy electrode portion 1230*c* in the groove G between the second counter electrode 2230 and the third counter electrode 3230 may contact (e.g., directly contact) the side surface of the metal bank layer 300 facing the groove G (e.g., the side surface of the first metal layer 310), and an outer portion of the third counter electrode 3230 may contact (e.g., directly contact) the side surface of the metal bank layer 300 facing the third opening OP3.

Although FIG. 4 shows the first light-emitting diode ED1 and the third light-emitting diode ED3 are spaced apart from each other with second light-emitting diode ED2 therebetween, embodiments are not limited thereto. The first light-emitting diode ED1 and the third light-emitting diode ED3 may be adjacent to each other. The outer portion of the third counter electrode 3230 may contact (e.g., directly contact) the side surface of the metal bank layer 300 facing the third opening OP3 (e.g., the side surface of the first metal layer 310), the outer portion of the (1-2)th dummy electrode portion 1230*c* in the groove between the first counter electrode 1230 and the third counter electrode 3230 may contact (e.g., directly contact) the side surface of the metal bank layer 300 facing the groove G (e.g., the side surface of the first metal layer 310), and the outer portion of the first counter electrode 1230 may contact (e.g., directly contact) the side surface of the metal bank layer 300 facing the first opening OP1 (e.g., the side surface of the first metal layer 310).

The first light-emitting diode ED1, the second light-emitting diode ED2, and the third light-emitting diode ED3 may be encapsulated by the encapsulation layer 500. According to an embodiment, FIG. 4 illustrates that the encapsulation layer 500 includes the first inorganic encapsulation layer 510, the organic encapsulation layer 520 on the first inorganic encapsulation layer 510, and the second inorganic encapsulation layer 530 on the organic encapsulation layer 520. Materials included in the first inorganic encapsulation layer 510, the organic encapsulation layer 520, and the second inorganic encapsulation layer 530 are as described above with reference to FIG. 3J.

The first inorganic encapsulation layer 510 may cover a structure and/or a layer under the first inorganic encapsulation layer 510. For example, the first inorganic encapsulation layer 510, which has relatively good step coverage, may cover an inner structure and/or layers of each of the first opening OP1, the second opening OP2, the third opening OP3, and the groove G. The first inorganic encapsulation layer 510 may overlap (or cover) a top surface (or upper surface) and side surfaces of the (1-1)th dummy electrode portion 1230*b*, side surfaces of the (1-1)th dummy portion 1220*b*, side surfaces and a bottom surface (or lower surface) of the second metal layer 320 corresponding to the first protruding portion PT1, the side surface of the first metal layer 310, and top surfaces (or upper surfaces) of the first counter electrode 1230, the second counter electrode 2230, and the third counter electrode 3230. For example, the first inorganic encapsulation layer 510 may overlap (or cover) the top surface (or upper surface) and side surfaces of the (1-1)th dummy electrode portion 1230*b*, the side surfaces of the (1-1)th dummy portion 1220*b*, the side surfaces and the bottom surface (or lower surface) of the second metal layer 320 corresponding to the second protruding portion PT2, the side surface of the first metal layer 310 facing the groove G, and a top surface (or upper surface) of the (1-2)th dummy electrode portion 1230*c*.

A portion of the organic encapsulation layer 520 may at least partially fill each of the first opening OP1, the second opening OP2, and the third opening OP3. Another portion of the organic encapsulation layer 520 may at least partially fill each of the grooves G.

FIGS. 6A to 6J are schematic cross-sectional views of a manufacturing process of a display apparatus according to an embodiment.

Figure 6A:
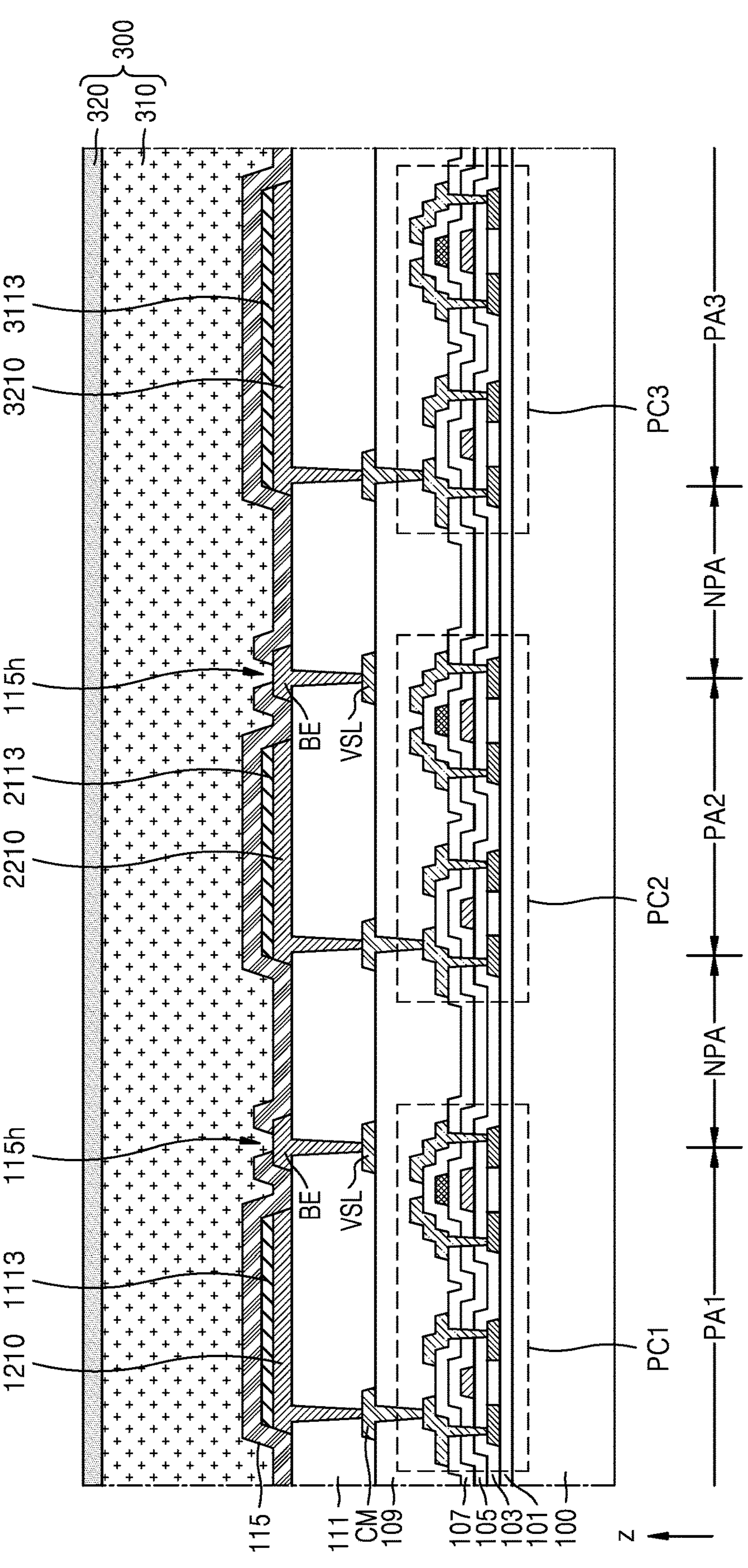
FIGS. 6A to 6J are schematic cross-sectional views of a manufacturing process of a display apparatus according to an embodiment.

Referring to FIG. 6A, the first subpixel electrode 1210, the second subpixel electrode 2210, and the third subpixel electrode 3210 may be formed on the substrate 100, and the bus electrodes BE may be formed. The first subpixel electrode 1210, the second subpixel electrode 2210, and the third subpixel electrode 3210 may be respectively arranged in the first subpixel area PA1, the second subpixel area PA2, and the third subpixel area PA3, and may be spaced apart from one another. The bus electrodes BE may each be arranged adjacent to any one of the first subpixel electrode 1210, the second subpixel electrode 2210, and the third subpixel electrode 3210. The first subpixel electrode 1210, the second subpixel electrode 2210, the third subpixel electrode 3210, and the bus electrodes BE may be formed together in a same process. The first subpixel electrode 1210, the second subpixel electrode 2210, the third subpixel electrode 3210, and the bus electrodes BE may include a same material.

The first subpixel circuit PC1, the second subpixel circuit PC2, the third subpixel circuit PC3, the first organic insulating layer 109, the second organic insulating layer 111, the contact metal CM, and the auxiliary conductive layer VSL may be formed between the substrate 100 and the first subpixel electrode 1210, the second subpixel electrode 2210, and the third subpixel electrode 3210 before forming the first subpixel electrode 1210, the second subpixel electrode 2210, and the third subpixel electrode 3210. According to an embodiment, FIG. 6A illustrates that the first subpixel circuit PC1, the second subpixel circuit PC2, and the third subpixel circuit PC3 has a same structure as the subpixel circuit PC (see FIG. 3A) described above with reference to FIG. 3A.

The substrate 100 may include glass or a polymer resin. The substrate 100 may include thereon, the buffer layer 101 formed to prevent permeation of impurities into the semiconductor layers of the transistors, the first gate insulating layer 103 between the semiconductor layer and the gate electrode, the first interlayer insulating layer 105 between the lower electrode and the upper electrode of the storage capacitor, and the second interlayer insulating layer 107 that insulates the source electrode/drain electrode and the gate electrode of the transistor.

The first subpixel circuit PC1, the second subpixel circuit PC2, and the third subpixel circuit PC3 may be respectively connected (e.g., electrically connected) to the first subpixel electrode 1210, the second subpixel electrode 2210, and the third subpixel electrode 3210 through the contact metals CM, and the bus electrodes may respectively connected (e.g., electrically connected) to the auxiliary conductive layers VSL. The bus electrode BE and the contact metal CM may be formed in a same process and may include same materials.

The first subpixel electrode 1210, the second subpixel electrode 2210, the third subpixel electrode 3210, and the bus electrodes BE may include a reflective layer including Ag, Mg, A1, Pt, Pd, Au, Ni, Nd, Ir, Cr, or compounds thereof, or a transparent conductive layer including ITO, IZO, ZnO, or $In_2O_3$. In some embodiments, the first subpixel electrode 1210, the second subpixel electrode 2210, the third subpixel electrode 3210, and the bus electrodes BE may have a structure in which an ITO layer/an Ag layer/an ITO layer are sequentially stacked.

The first protective layer 1113, the second protective layer 2113, and the third protective layer 3113 may be formed to overlap the first subpixel electrode 1210, the second subpixel electrode 2210, and the third subpixel electrode 3210, respectively. The first protective layer 1113, the second protective layer 2113, and the third protective layer 3113 may include a conductive oxide (e.g., transparent conductive oxide) such as ITO, IZO, IGZO, ITZO, ZnO, AZO, ZTO, GTO, FTO, and the like. The first protective layer 1113, the second protective layer 2113, the third protective layer 3113, the first subpixel electrode 1210, the second subpixel electrode 2210, and the third subpixel electrode 3210 may be patterned together in a same process.

For example, the metal bank layer 300 including the first metal layer 310 and the second metal layer 320 may be formed above the first protective layer 1113, the second protective layer 2113, and the third protective layer 3113. The insulating layer 115 may be formed before the metal bank layer 300 is formed. The insulating layer 115 may include the contact hole 115*h* exposing a portion of the bus electrode BE.

Material layers corresponding to the metal bank layer 300, e.g., the first metal layer 310 and the second metal layer 320 on the first metal layer 310, may be formed on the insulating layer 115. Features such as materials and thicknesses of the first metal layer 310 and the second metal layer 320 are as described above with reference to FIG. 3C. For example, a thickness of the first metal layer 310 may be greater than a thickness of the second metal layer 320. The bottom surface (or lower surface) of the first metal layer 310 may be electrically connected to (e.g., directly contact) the bus electrode BE through the contact hole 115*h* of the insulating layer 115.

Figure 6B:
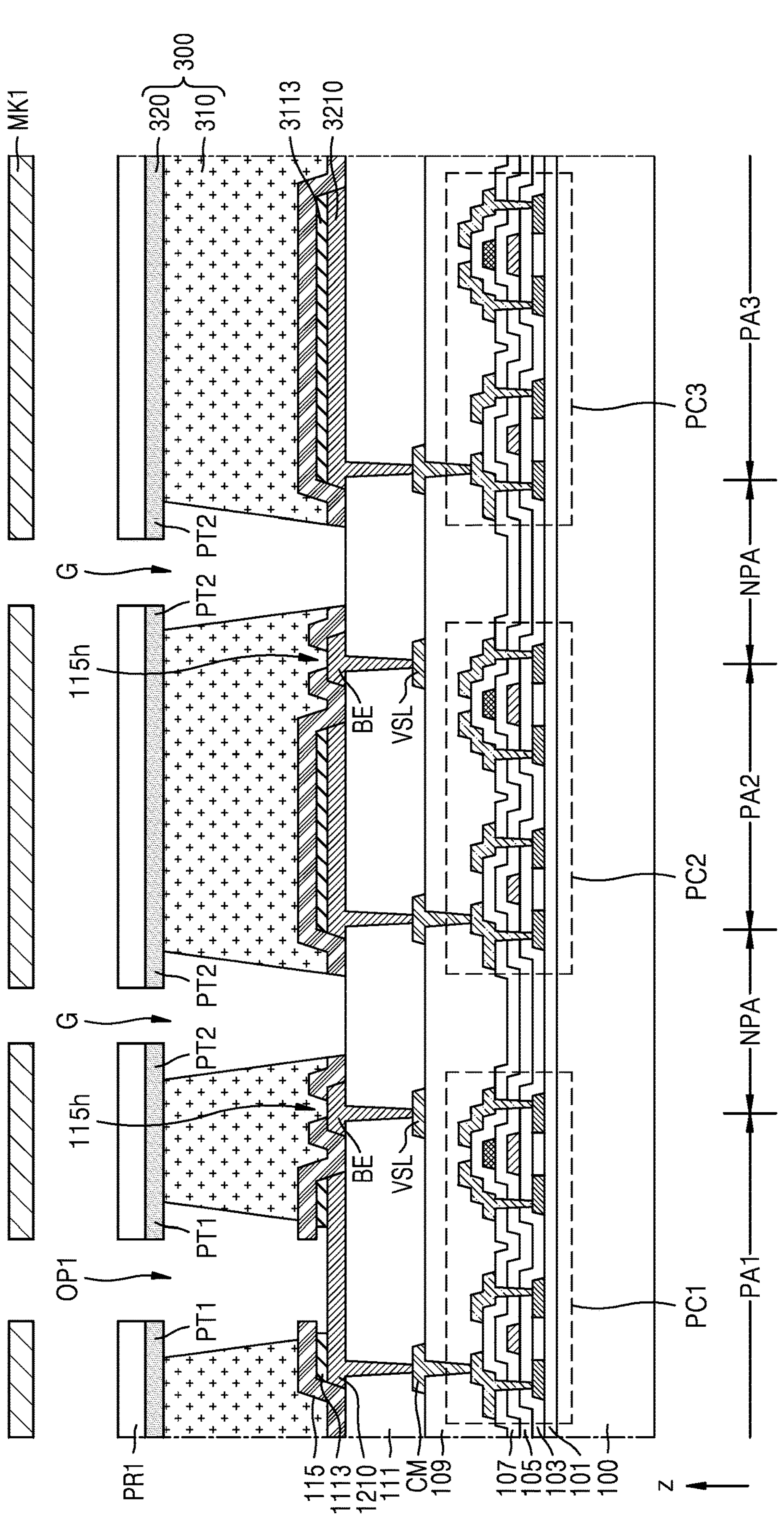

Referring to FIG. 6B, a first photoresist PR1 including opening areas may be formed on the second metal layer 320. Openings of the first photoresist PR1 may respectively overlap the first subpixel area PA1 and the non-subpixel area NPA. The first photoresist PR1 may be formed by forming a photosensitive material layer on the second metal layer 320 and by exposing and developing the photosensitive material layer by using a first mask MK1.

For example, the first opening OP1 may be formed by removing a portion of the second metal layer 320 and a portion of the first metal layer 310 in a first subpixel area PA1 by using the first photoresist PR1 as a mask. For example, a portion of the insulating layer 115 and a portion of the first protective layer 1113 may each be removed. A detailed process of removing a portion of the second metal layer 320, a portion of the first metal layer 310, a portion of the insulating layer 115, and a portion of the first protective layer 1113 and structural features thereof are as described above with reference to FIGS. 3D to 3H. For example, a slope angle of the side surface of the first metal layer 310 facing the first opening OP1 may be equal to or greater than about 60° and smaller than about 90°.

In a process of forming the first opening OP1 of the metal bank layer 300, the groove G may be formed in the non-subpixel area NPA. The groove G and the first opening OP1 may be formed in a same etching process. In the process of forming the first opening OP1, the groove G may be formed by removing a portion of the metal bank layer 300 and a portion of the insulating layer 115 in the non-subpixel area NPA by using the first photoresist PR1 as a mask.

As the first photoresist PR1 covers the second subpixel area PA2 and the third subpixel area PA3, some of the layers between the second subpixel electrode 2210 and the first photoresist PR1 and some of the layers between the third subpixel electrode 3210 and the first photoresist PR1 may not be removed.

The first opening OP1 may have an undercut-shaped cross-section structure having the first protruding portion PT1, and the groove G may have an undercut-shaped cross-section structure having the second protruding portion PT2. Although FIG. 6B illustrates that the bottom surface (or lower surface) of the groove G is substantially identical to the top surface (or upper surface) of the second organic insulating layer 111, embodiments are not limited thereto. The bottom surface (or lower surface) of the groove G may be at an opposite side of the top surface (or upper surface) of the substrate 100, with the top surface (or upper surface) of the second organic insulating layer 111 therebetween in the z direction. For example, the depth of the groove G according to an embodiment may be smaller than the depth of the groove G shown in FIG. 6B. In another example, the depth of the groove G according to an embodiment may be greater than the depth of the groove G shown in FIG. 6B.

Figure 6C:
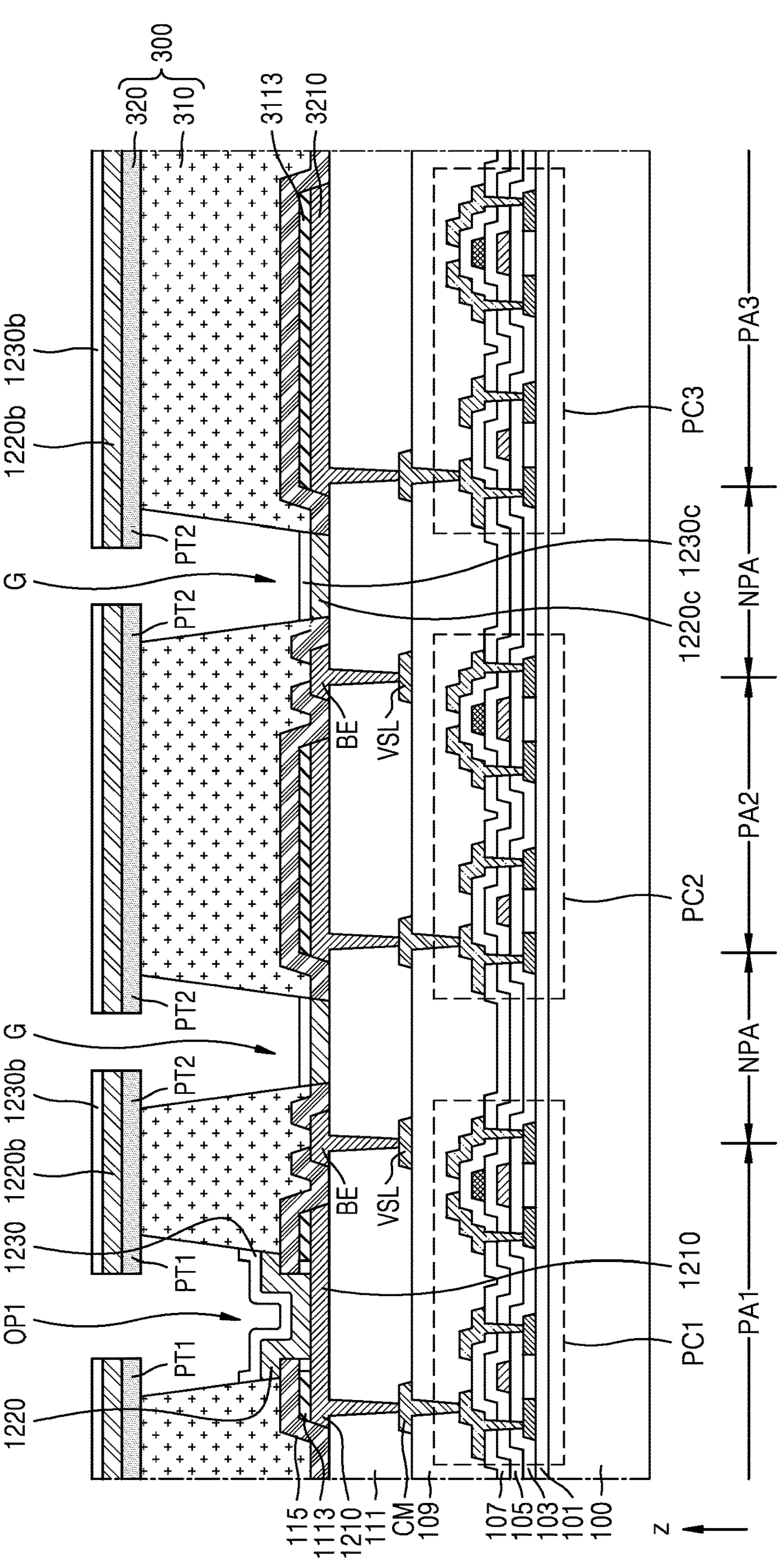

Referring to FIG. 6C, the first photoresist PR1 may be removed, and the first intermediate layer 1220 and the first counter electrode 1230 may be formed. As described above with reference to FIG. 3K, the first intermediate layer 1220 may have a multi-layer structure including the first common layer, the emission layer, and/or the second common layer. The first intermediate layer 1220 and the first counter electrode 1230 may each be formed by a deposition method such as a thermal deposition process.

The first intermediate layer 1220 may be formed on the first subpixel electrode 1210 through the first opening OP1 of the metal bank layer 300. An inner portion of the first intermediate layer 1220 may contact (e.g., directly contact) the inner portion of the first subpixel electrode 1210, and the outer portion of the first intermediate layer 1220 may be disposed on the insulating layer 115.

The first counter electrode 1230 may overlap the first intermediate layer 1220. In a deposition process, an incident angle of a material for forming the first counter electrode 1230 and an incident angle of a material for forming the first intermediate layer 1220 may be different from each other. In a deposition process of forming the first counter electrode 1230, the outer portion (or a peripheral portion) of the first counter electrode 1230 may contact (e.g., directly contact) the side surface of the first metal layer 310 facing the first opening OP1. For example, an edge portion or the outer portion (or the peripheral portion) of the first counter electrode 1230 may extend beyond an edge portion or the outer portion (or the peripheral portion) of the first intermediate layer 1220 and may contact (e.g., directly contact) the side surface of the first metal layer 310.

As the first intermediate layer 1220 and the first counter electrode 1230 are deposited without using a mask, the material for forming the first intermediate layer 1220 and the material for forming the first counter electrode 1230 may be deposited in other areas as well as the first subpixel area PA1, for example, the second subpixel area PA2, the third subpixel area PA3, and the non-subpixel area NPA.

Due to a structure of the first opening OP1 of the metal bank layer 300 including the first protruding portion PT1, the first intermediate layer 1220 may be separate and spaced apart from the (1-1)th dummy portion 1220*b* disposed above the metal bank layer 300, and the first counter electrode 1230 may be separate and spaced apart from the (1-1)th dummy electrode portion 1230*b* disposed above the metal bank layer 300.

Due to the structure of the groove G of the metal bank layer 300 including the second protruding portion PT2, the (1-1)th dummy portion 1220*b* above the metal bank layer 300 and the (1-2)th dummy portion 1220*c* formed in the groove G may be separate and spaced apart from each other, and the (1-1)th dummy electrode portion 1230*b* above the metal bank layer 300 and the (1-2)th dummy electrode portion 1230*c* formed in the groove G may be separate and spaced apart from each other. An edge portion or an outer portion (or a peripheral portion) of the (1-2)th dummy electrode portion 1230*c* formed in the groove G may contact (e.g., directly contact) the side surface of the metal bank layer 300 facing the groove G.

The first intermediate layer 1220, the (1-1)th dummy portion 1220*b*, and the (1-2)th dummy portion 1220*c* may include a same material and/or a same number of sublayers (e.g., the first common layer, the emission layer, and the second common layer). The first counter electrode 1230, the (1-1)th dummy electrode portion 1230*b*, and the (1-2)th dummy electrode portion 1230*c* may include a same material.

Figure 6D:
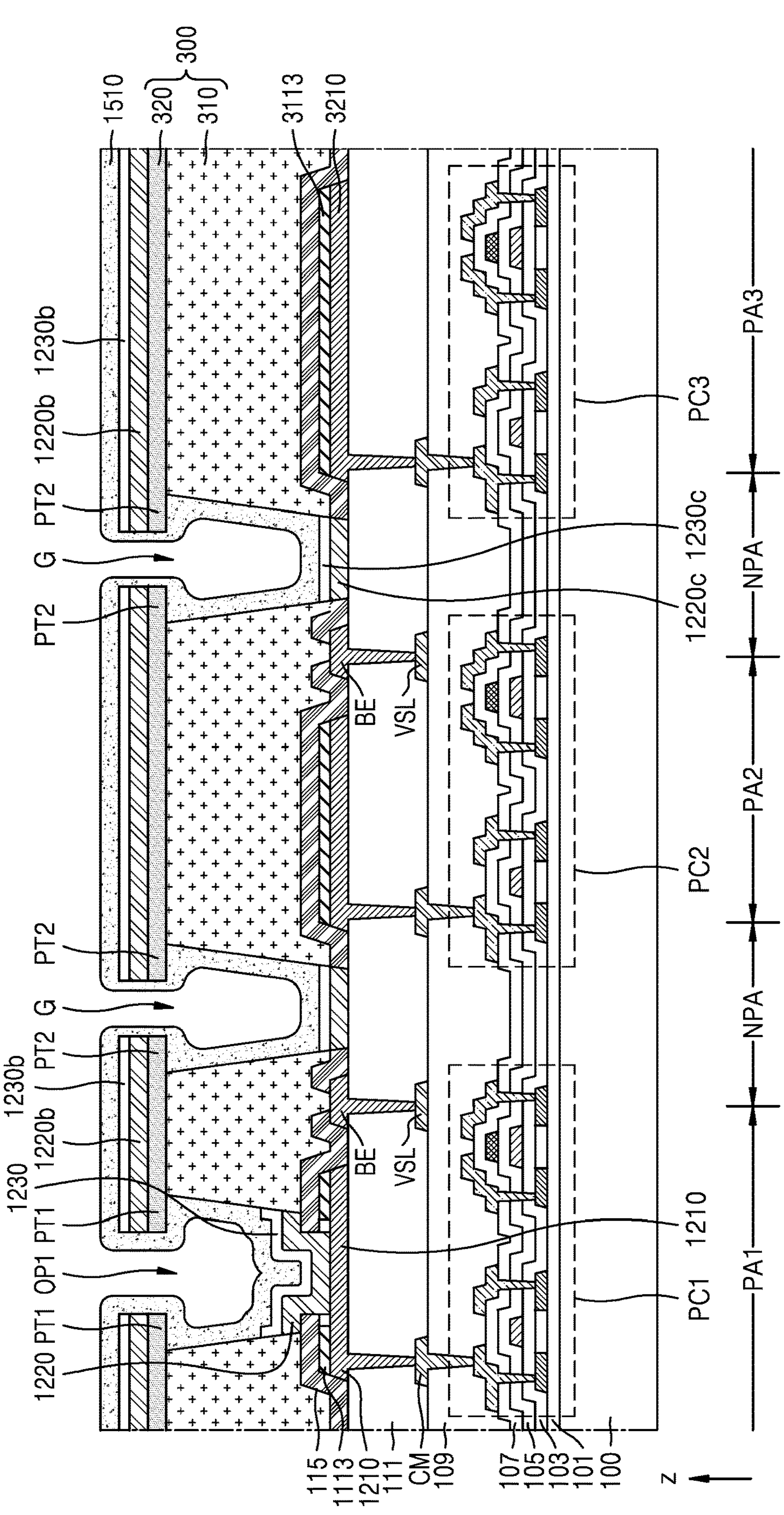

Referring to FIG. 6D, a first inorganic barrier layer 1510 may be formed on the structure described with reference to FIG. 6C. The first inorganic barrier layer 1510 may include one or more inorganic materials from among aluminum oxide, titanium oxide, tantalum oxide, hafnium oxide, zinc oxide, silicon oxide, silicon nitride, and silicon oxynitride, and may be deposited in a scheme such as chemical vapor deposition method. The first inorganic barrier layer 1510, which has extraordinary step coverage, may continuously cover the structure described with reference to FIG. 6C.

Figure 6E:
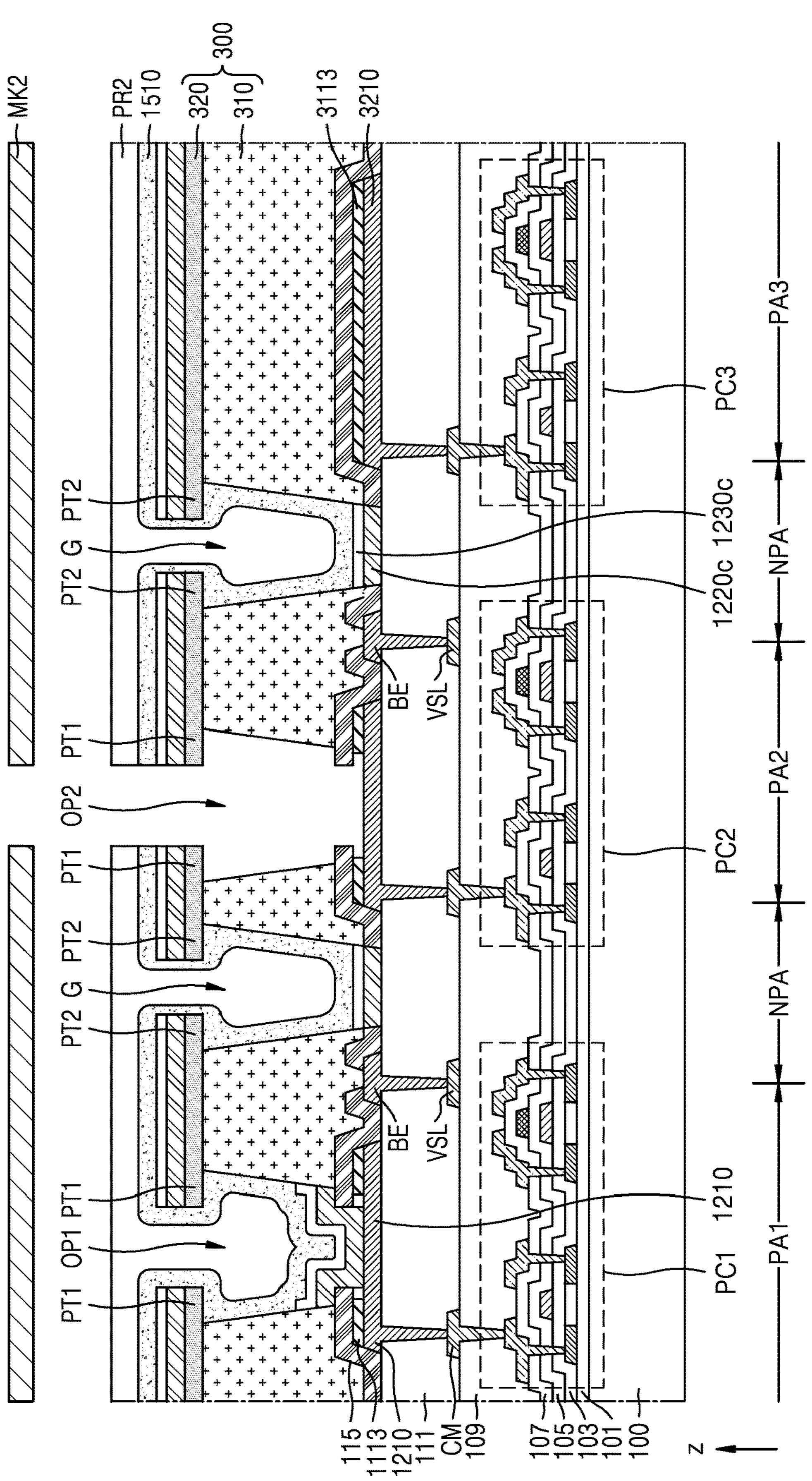

Referring to FIG. 6E, a second photoresist PR2 including an opening area may be formed on the first inorganic barrier layer 1510. An opening of the second photoresist PR2 may overlap the second subpixel area PA2. The second photoresist PR2 may be formed by forming a photosensitive material layer on the first inorganic barrier layer 1510 and exposing and developing the photosensitive material layer by using a second mask MK2.

For example, the second opening OP2 may be formed by removing a portion of the metal bank layer 300 in the second subpixel area PA2 by using the second photoresist PR2 as a mask. Thereafter, a portion of the insulating layer 115 and a portion of the first protective layer 1113 may each be removed. A detailed process of removing a portion of the metal bank layer 300, a portion of the insulating layer 115, and a portion of the first protective layer 1113 and structural features thereof are as described above with reference to FIGS. 3D to 3H. For example, a slope angle of the side surface of the first metal layer 310 facing the second opening OP2 may be equal to or greater than about 60° and smaller than about 90°. Like the first opening OP1, the second opening OP2 may have an undercut-shaped cross-section structure having the first protruding portion PT1.

Figure 6F:
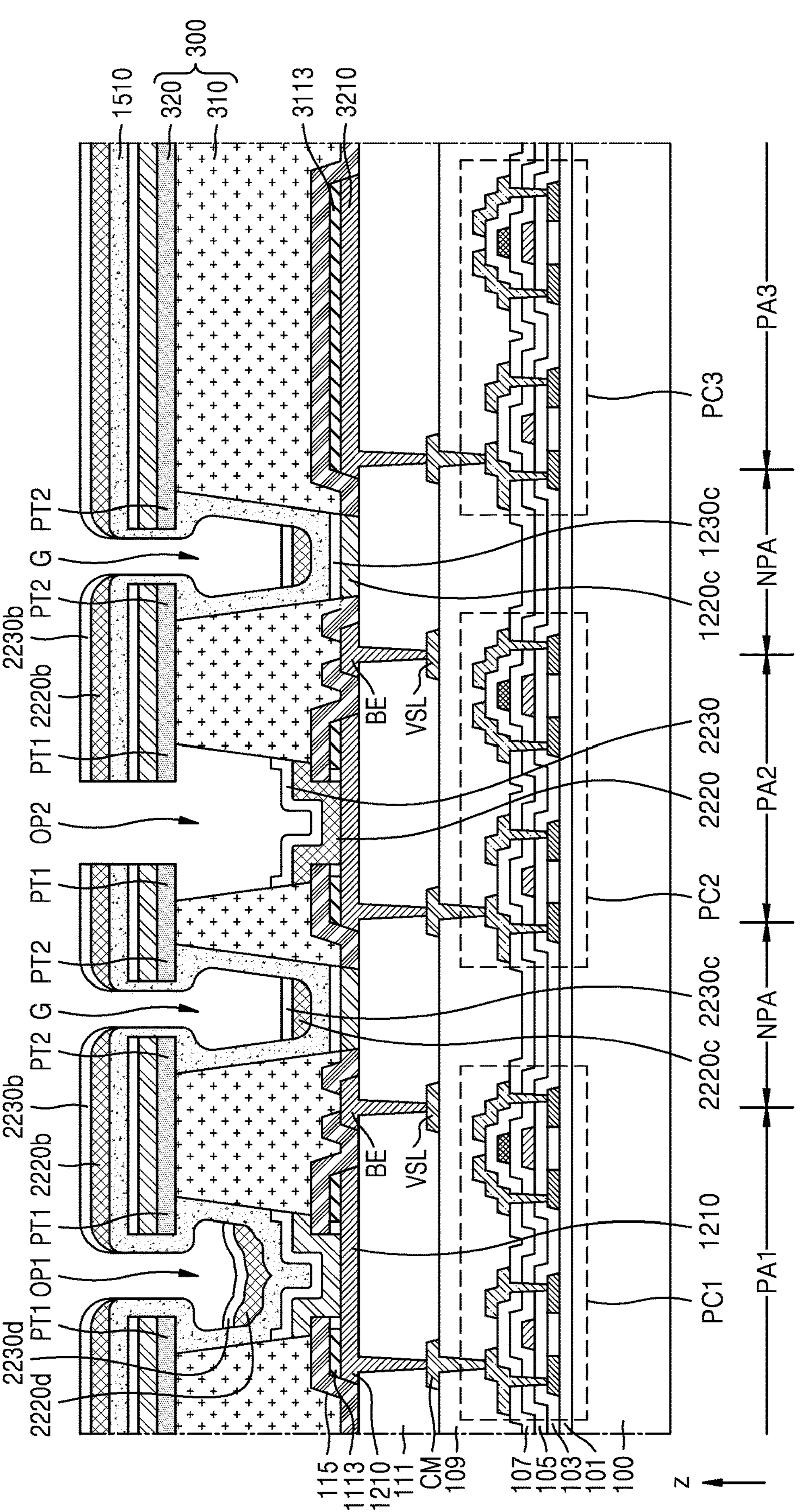

Referring to FIG. 6F, the second photoresist PR2 may be removed, and the second intermediate layer 2220 and the second counter electrode 2230 may be formed. As described above with reference to FIG. 3K, the second intermediate layer 2220 may have a multi-layer structure including the first common layer, the emission layer, and/or the second common layer. The second intermediate layer 2220 and the second counter electrode 2230 may each be formed by a deposition method such as a thermal deposition process.

An edge portion or outer portion (or a peripheral portion) of the second counter electrode 2230 may be formed to contact (e.g., directly contact) the side surface of the first metal layer 310 facing the second opening OP2. For example, the edge portion or outer portion (or the peripheral portion) of the second counter electrode 2230 may extend beyond an edge portion or outer portion (or a peripheral portion) of the second intermediate layer 2220, and may contact (e.g., directly contact) the side surface of the first metal layer 310.

As the second intermediate layer 2220 and the second counter electrode 2230 are deposited without using a mask, a material for forming the second intermediate layer 2220 and a material for forming the second counter electrode 2230 may be deposited in other areas as well as the second subpixel area PA2, for example, the first subpixel area PA1, the third subpixel area PA3, and the non-subpixel area NPA.

Due to the structure of the second opening OP2 of the metal bank layer 300 including the first protruding portion PT1, the second intermediate layer 2220 may be separated and spaced apart from a (2-1)th dummy portion 2220*b* disposed above the metal bank layer 300, and the second counter electrode 2230 may be separate and spaced apart from a (2-1)th dummy electrode portion 2230*b* disposed above the metal bank layer 300.

Due to the structure of the groove G of the metal bank layer 300 including the second protruding portion PT2, the (2-1)th dummy portion 2220*b* above the metal bank layer 300 and a (2-2)th dummy portion 2220*c* formed in the groove G may be separate and spaced apart from each other, and the (2-1)th dummy electrode portion 2230*b* above the metal bank layer 300 may be separate and spaced apart from a (2-2)th dummy electrode portion 2230*c* formed in the groove G.

Due to the structure of the first opening OP1 of the metal bank layer 300 including the first protruding portion PT1, a (2-3)th dummy portion 2220*d* formed in the first opening OP1 may be separate and spaced apart from the (2-1)th dummy portion 2220*b* above the metal bank layer 300, and a (2-3)th dummy electrode portion 2230*d* formed in the first opening OP1 may be separate and spaced apart from the (2-1)th dummy electrode portion 2230*b* above the metal bank layer 300.

The second intermediate layer 2220, the (2-1)th dummy portion 2220*b*, the (2-2)th dummy portion 2220*c*, and the (2-3)th dummy portion 2220*d* may include a same material and/or a same number of sublayers (e.g., the first common layer, the emission layer, and the second common layer). The second counter electrode 2230, the (2-1)th dummy electrode portion 2230*b*, the (2-2)th dummy electrode portion 2230*c*, and the (2-3)th dummy electrode portion 2230*d* may include a same material.

Figure 6G:
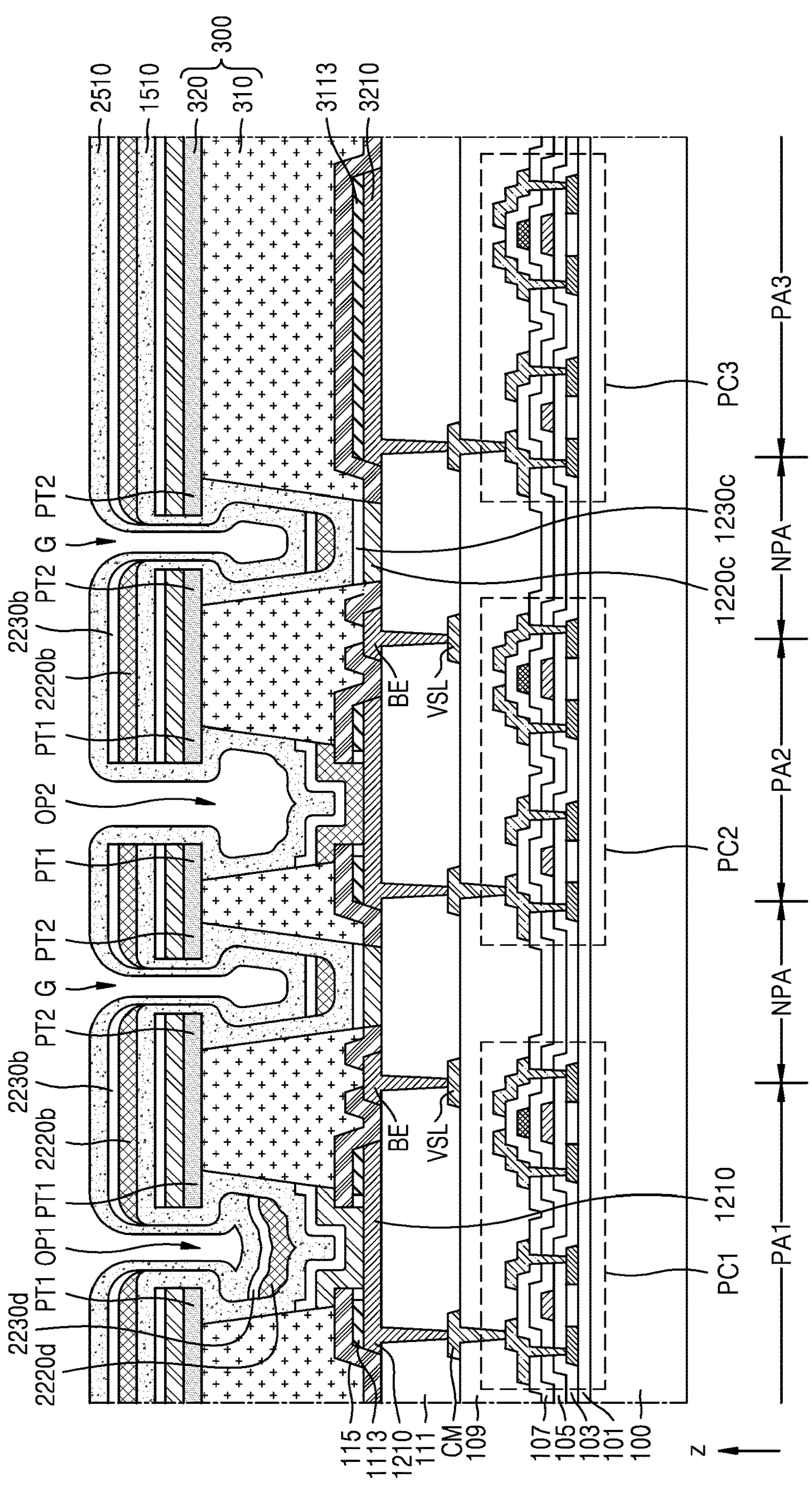

Referring to FIG. 6G, a second inorganic barrier layer 2510 may be formed above the structure described with reference to FIG. 6F. The second inorganic barrier layer 2510 may include one or more inorganic materials from among aluminum oxide, titanium oxide, tantalum oxide, hafnium oxide, zinc oxide, silicon oxide, silicon nitride, and silicon oxynitride, and may be deposited in a scheme such as chemical vapor deposition method. The second inorganic barrier layer 2510, which has extraordinary step coverage, may continuously cover the structure described with reference to FIG. 6F.

Figure 6H:
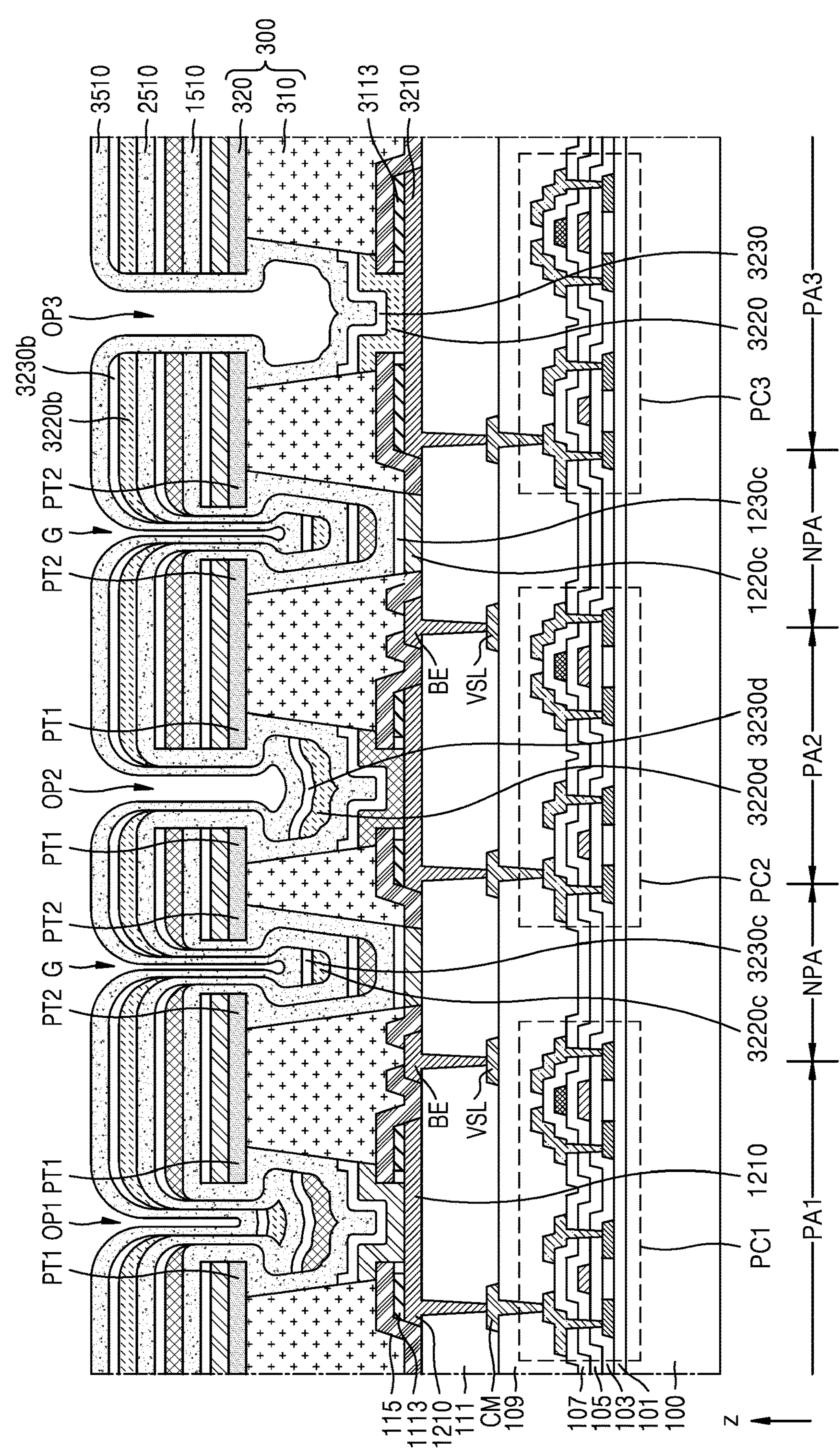

Referring to FIG. 6H, a third photoresist including an opening area corresponding to the third subpixel area PA3 may be formed, and the third opening OP3 may be formed in the metal bank layer 300 by using the third photoresist. A process for forming the third opening OP3 is as described above with reference to FIGS. 3D to 3H.

Thereafter, the third photoresist may be removed, and the third intermediate layer 3220 and the third counter electrode 3230 may be formed. As described above with reference to FIG. 3K, the third intermediate layer 3220 may have a multi-layer structure including the first common layer, the emission layer, and/or the second common layer. The third intermediate layer 3220 and the third counter electrode 3230 may each be formed by a deposition method such as a thermal deposition process.

The third intermediate layer 3220 may be formed above the third subpixel electrode 3210 through the third opening OP3 of the metal bank layer 300. An inner portion of the third intermediate layer 3220 may contact (e.g., directly contact) an inner portion of the third subpixel electrode 3210, and an outer portion of the third intermediate layer 3220 may be above the insulating layer 115.

An edge portion or an outer portion (or a peripheral portion) of the third counter electrode 3230 may contact (e.g., directly contact) the side surface of the first metal layer 310 facing the third opening OP3. For example, the edge portion or the outer portion (or the peripheral portion) of the third counter electrode 3230 may extend beyond an edge portion or an outer portion (or a peripheral portion) of the third intermediate layer 3220, and may contact (e.g., directly contact) the side surface of the first metal layer 310.

As the third intermediate layer 3220 and the third counter electrode 3230 are deposited without using a mask, a material for forming the third intermediate layer 3220 and a material for forming the third counter electrode 3230 may be deposited in other areas as well as the third subpixel area PA3, for example, the first subpixel area PA1, the second subpixel area PA2, and the non-subpixel area NPA.

Due to a structure of the third opening OP3 of the metal bank layer 300 including the first protruding portion PT1, the third intermediate layer 3220 may be separate and spaced apart from a (3-1)th dummy portion 3220*b* disposed above the metal bank layer 300, and the third counter electrode 3230 may be separate and spaced apart from a (3-1)th dummy electrode portion 3230*b* disposed above the metal bank layer 300.

Due to the structure of the groove G of the metal bank layer 300 including the second protruding portion PT2, the (3-1)th dummy portion 3220*b* above the metal bank layer 300 and a (3-2)th dummy portion 3220*c* formed in the groove G may be separate and spaced apart from each other, and the (3-1)th dummy electrode portion 3230*b* above the metal bank layer 300 may be separate and spaced apart from a (3-2)th dummy electrode portion 3230*c* formed in the groove G.

Due to the structures of the first opening OP1 and the second opening OP2 of the metal bank layer 300 including the first protruding portion PT1, a (3-3)th dummy portion 3220*d* formed in each of the first opening OP1 and the second opening OP2 may be separate and spaced apart from the (3-1)th dummy portion 3220*b* above the metal bank layer 300, and a (3-3)th dummy electrode portion 3230*d* formed in each of the first opening OP1 and the second opening OP2 may be separate and spaced apart from the (3-1)th dummy electrode portion 3230*b* above the metal bank layer 300.

The third intermediate layer 3220, the (3-1)th dummy portion 3220*b*, the (3-2)th dummy portion 3220*c*, and the (3-3)th dummy portion 3220*d* may include a same material and/or a same number of sublayers (e.g., the first common layer, the emission layer, and the second common layer). The third counter electrode 3230, the (3-1)th dummy electrode portion 3230*b*, the (3-2)th dummy electrode portion 3230*c*, and the (3-3)th dummy electrode portion 3230*d* may include a same material.

Thereafter, a third inorganic barrier layer 3510 may be formed. The third inorganic barrier layer 3510 may include one or more inorganic materials from among aluminum oxide, titanium oxide, tantalum oxide, hafnium oxide, zinc oxide, silicon oxide, silicon nitride, and silicon oxynitride, and may be deposited in a scheme such as chemical vapor deposition method. The third inorganic barrier layer 3510, which has extraordinary step coverage, may continuously cover a structure under the third inorganic barrier layer 3510.

Figure 6I:
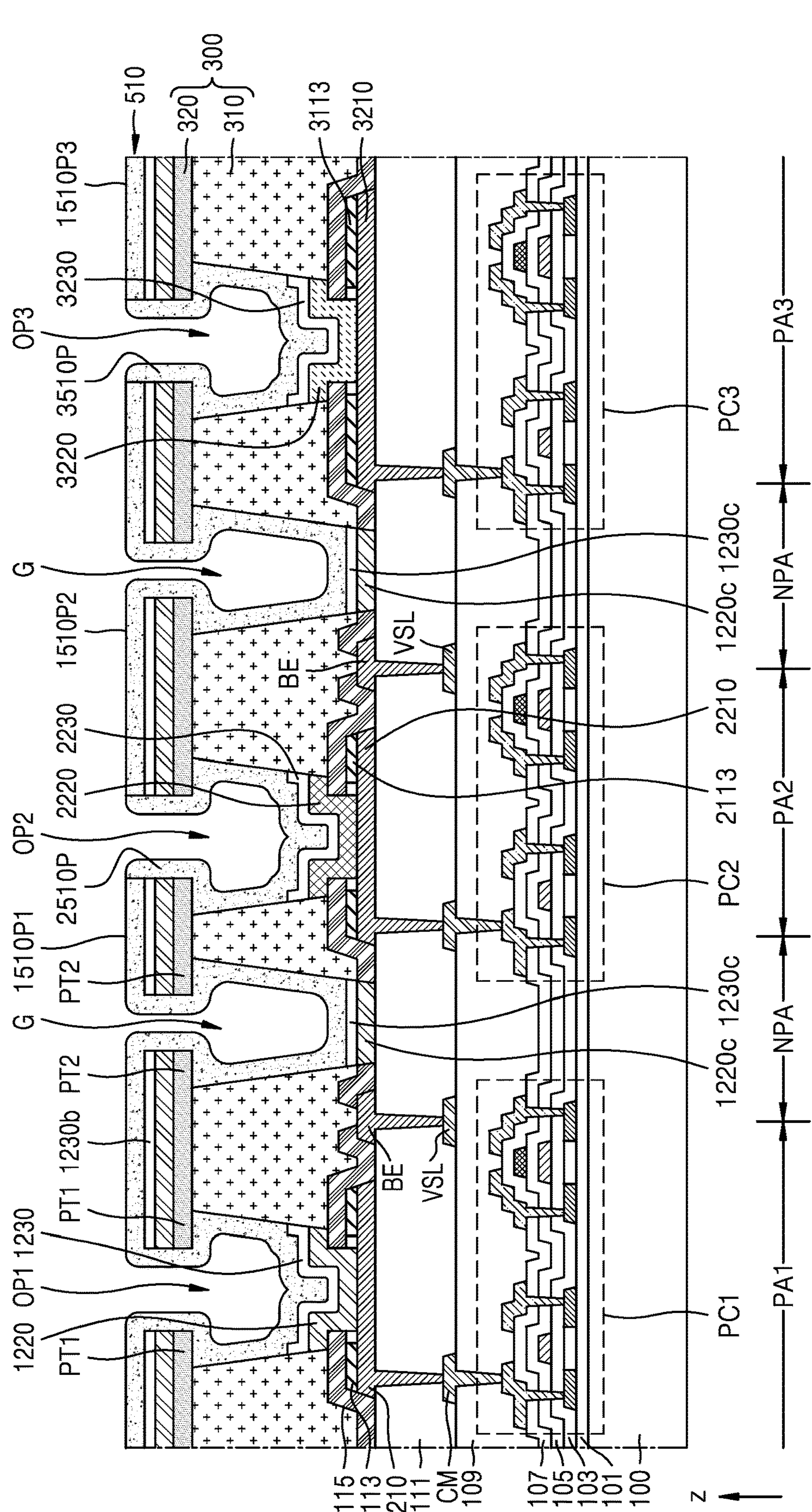

Referring to FIG. 6I, dummy intermediate layer(s) and dummy counter electrode(s) arranged in the first subpixel area PA1 and the second subpixel area PA2 may be removed by an etching process (e.g., a dry etching process). For example, the (2-3)th dummy portion 2220*d*, the (2-3)th dummy electrode portion 2230*d*, the (3-3)th dummy portion 3220*d*, and the (3-3)th dummy electrode portion 3230*d* in the first subpixel area PA1 may be removed, and the (3-3)th dummy portion 3220*d* and the (3-3)th dummy electrode portion 3230*d* in the second subpixel area PA2 may be removed. For example, a portion of each of the first inorganic barrier layer, the second inorganic barrier layer, and the third inorganic barrier layer may also be removed.

By an etching process, intermediate layers and counter electrodes corresponding to the respective subpixel areas may be arranged in the first subpixel area PA1, the second subpixel area PA2, and the third subpixel area PA3. For example, the first intermediate layer 1220 and the first counter electrode 1230 may be above the first subpixel electrode 1210 of the first subpixel area PAL The second intermediate layer 2220 and the second counter electrode 2230 may be above the second subpixel electrode 2210 of the second subpixel area PA2. The third intermediate layer 3220 and a third counter electrode 3230 may be above the third subpixel electrode 3210 of the third subpixel area PA3.

The first counter electrode 1230 may be covered by a first portion 1510P1 of the first inorganic barrier layer, and the second counter electrode 2230 may be covered by a portion 2510P of the second inorganic barrier layer. The third counter electrode 3230 may be covered by a portion 3510P of the third inorganic barrier layer.

The first portion 1510P1 of the first inorganic barrier layer may extend to cover the (1-1)th dummy electrode portion 1230*b* and the (1-2)th dummy electrode portion 1230*c* in the non-subpixel area NPA, and may contact (e.g., directly contact) a portion 2510P of the second inorganic barrier layer covering the second counter electrode 2230. A second portion 1510P2 of the first inorganic barrier layer covering the first dummy electrode portion 1230*b* (e.g., the (1-1)th dummy electrode portion 1230*b*) in the non-subpixel area NPA may contact each of the portion 2510P of the second inorganic barrier layer and the portion 3510P of the third inorganic barrier layer, and may overlap the groove G. A third portion 1510P3 of the first inorganic barrier layer covering the first dummy electrode portion 1230*b* (e.g., the (1-1)th dummy electrode portion 1230*b*) in the non-subpixel area NPA may contact the portion 3510P of the third inorganic barrier layer covering the third counter electrode 3230.

The portions of the first to third inorganic barrier layers contacting one another may together form the first inorganic encapsulation layer 510. According to another embodiment, an additional inorganic barrier layer may be formed above the first inorganic encapsulation layer 510 shown in FIG. 6I. The additional inorganic barrier layer may be consecutively formed, unlike the first inorganic encapsulation layer 510 formed by contact among the portions of the first to third inorganic barrier layers.

Figure 6J:
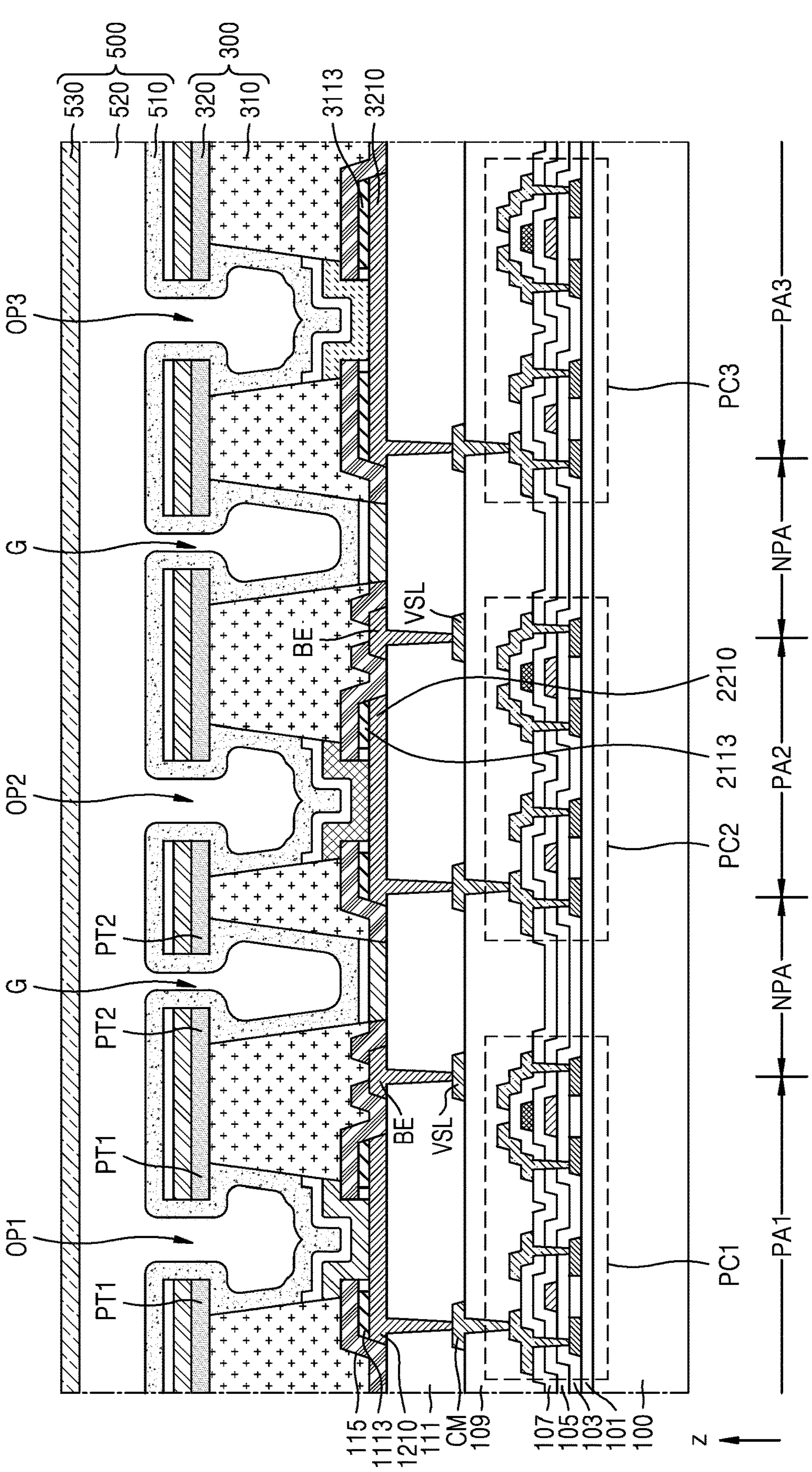

Referring to FIG. 6J, the organic encapsulation layer 520 and the second inorganic encapsulation layer 530 may be formed above the first inorganic encapsulation layer 510.

The organic encapsulation layer 520 may be formed by coating and curing monomer. In some embodiments, a portion of the organic encapsulation layer 520 may at least partially fill the first opening OP1, the second opening OP2, the third opening OP3, and/or the groove G.

The second inorganic encapsulation layer 530 may include one or more inorganic materials from among aluminum oxide, titanium oxide, tantalum oxide, hafnium oxide, zinc oxide, silicon oxide, silicon nitride, and silicon oxynitride, and may be deposited in a scheme such as chemical vapor deposition method.

According to an embodiment, intermediate layers and counter electrodes of light-emitting diodes may be formed without using masks, and therefore, components included in the display apparatus may be prevented from damages. For example, voltage drop of the counter electrode may be prevented by using electrical connection between the counter electrode and the metal bank layer and electrical connection between the bus electrode and the metal bank layer.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display apparatus comprising:

a first subpixel electrode;

a bus electrode adjacent to the first subpixel electrode;

a metal bank layer including a first opening overlapping the first subpixel electrode, the metal bank layer comprising a first metal layer and a second metal layer disposed on the first metal layer;

an insulating layer disposed on the first subpixel electrode and the bus electrode and under the metal bank layer;

a first intermediate layer overlapping the first subpixel electrode in the first opening of the metal bank layer; and a first counter electrode disposed on the first intermediate layer in the first opening of the metal bank layer, wherein the metal bank layer is electrically connected to the bus electrode through a contact hole defined in the insulating layer.

2. The display apparatus of claim 1, wherein the first counter electrode contacts a side surface of the metal bank layer facing the first opening.

3. The display apparatus of claim 2, wherein an outer portion of the first counter electrode contacts a side surface of the first metal layer facing the first opening.

4. The display apparatus of claim 1, wherein a lower surface of the metal bank layer contacts the bus electrode through the contact hole of the insulating layer.

5. The display apparatus of claim 1, wherein a portion of the second metal layer facing the first opening of the metal bank layer comprises a protruding portion extending toward the first opening from a point at which a lower surface of the second metal layer contacts a side surface of the first metal layer.

6. The display apparatus of claim 5, wherein a length of the protruding portion of the second metal layer is in a range of about 0.3 μm to about 1 μm.

7. The display apparatus of claim 1, further comprising:

a protective layer between an outer portion of the first subpixel electrode and the insulating layer.

8. The display apparatus of claim 7, wherein the protective layer comprises a transparent conductive oxide.

9. The display apparatus of claim 1, further comprising:

a first dummy intermediate layer disposed on the second metal layer, wherein the first dummy intermediate layer and the first intermediate layer include a same material.

10. The display apparatus of claim 9, further comprising:

a first dummy counter electrode disposed on the first dummy intermediate layer, wherein the first dummy counter electrode and the first counter electrode include a same material.

11. The display apparatus of claim 1, further comprising a second subpixel electrode;

a second intermediate layer overlapping the second subpixel electrode in a second opening of the metal bank layer; and a second counter electrode overlapping the second intermediate layer in the second opening of the metal bank layer.

12. The display apparatus of claim 11, wherein the metal bank layer further comprises a groove disposed between the first subpixel electrode and the second subpixel electrode, the groove concaved from an upper surface of the metal bank layer, and each of the bus electrode and the groove is disposed between the first subpixel electrode and the second subpixel electrode.

13. The display apparatus of claim 1, further comprising:

an auxiliary conductive layer electrically connected to the bus electrode.

14. A method of manufacturing a display apparatus, the method comprising:

forming a first subpixel electrode;

forming a bus electrode adjacent to the first subpixel electrode;

forming an insulating layer overlapping an outer portion of the first subpixel electrode and an outer portion of the bus electrode, the insulating layer including a contact hole exposing a portion of the bus electrode;

forming a metal bank layer including a first opening overlapping the first subpixel electrode and including a first metal layer and a second metal layer on the first metal layer, the metal bank layer electrically connected to the bus electrode through the contact hole of the insulating layer;

forming a first intermediate layer overlapping the first subpixel electrode in the first opening of the metal bank layer; and forming a first counter electrode disposed on the first intermediate layer in the first opening of the metal bank layer.

15. The method of claim 14, wherein the forming of the first counter electrode comprises depositing the first counter electrode such that an outer portion of the first counter electrode contacts an outer portion of the first metal layer facing the first opening of the metal bank layer.

16. The method of claim 14, wherein a lower surface of the metal bank layer contacts the bus electrode through the contact hole of the insulating layer.

17. The method of claim 14, wherein the forming of the metal bank layer comprises:

forming an opening overlapping the first subpixel electrode in each of the first metal layer and the second metal layer; and selectively etching the second metal layer among the first metal layer and the second metal layer, and the second metal layer comprises a protruding portion extending toward the first opening from a point at which a lower surface of the second metal layer contacts a side surface of the first metal layer.

18. The method of claim 14, further comprising:

forming a protective layer disposed between the outer portion of the first subpixel electrode and the insulating layer, the protective layer comprising a transparent conductive oxide.

19. The method of claim 14, further comprising:

forming a second subpixel electrode adjacent to the first subpixel electrode; and forming a groove corresponding to a space between the first subpixel electrode and the second subpixel electrode in the metal bank layer.

20. The method of claim 19, wherein the groove and the bus electrode are between the first subpixel electrode and the second subpixel electrode.

* * * * *